United States Patent
Ogawa et al.

(10) Patent No.: US 10,403,632 B2
(45) Date of Patent: Sep. 3, 2019

(54) 3D NAND DEVICE WITH FIVE-FOLDED MEMORY STACK STRUCTURE CONFIGURATION

(71) Applicant: SANDISK TECHNOLOGIES LLC, Plano, TX (US)

(72) Inventors: Hiroyuki Ogawa, Yokkaichi (JP); Hiroyuki Tanaka, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/874,099

(22) Filed: Jan. 18, 2018

(65) Prior Publication Data

US 2018/0158834 A1    Jun. 7, 2018

Related U.S. Application Data

(63) Continuation of application No. 15/174,030, filed on Jun. 6, 2016, now Pat. No. 9,899,399.

(Continued)

(51) Int. Cl.
*H01L 23/522* (2006.01)
*H01L 23/528* (2006.01)
(Continued)

(52) U.S. Cl.
CPC .... *H01L 27/11556* (2013.01); *H01L 23/5226* (2013.01); *H01L 23/5283* (2013.01);
(Continued)

(58) Field of Classification Search
CPC ......... H01L 27/11582; H01L 27/11556; H01L 27/11524; H01L 27/1157; H01L 21/76802;
(Continued)

(56) References Cited

U.S. PATENT DOCUMENTS

| 5,915,167 A | 6/1999 | Leedy |
| 7,005,350 B2 | 2/2006 | Walker et al. |

(Continued)

FOREIGN PATENT DOCUMENTS

| JP | 2015079862 A | 4/2015 |
| WO | WO2002/015277 A1 | 2/2002 |

OTHER PUBLICATIONS

Chen et al., "Formation of $NiSi_2/SiN_x$ Compound Nanocrystal for Nonvolatile Memory Application," Thin Solid Films, Elsevier-Sequoia S.A., Lausanne, Switzerland, vol. 518, No. 24, pp. 7324-7327 (2010).

(Continued)

*Primary Examiner* — Mouloucoulaye Inoussa
(74) *Attorney, Agent, or Firm* — The Marbury Law Group, PLLC

(57) ABSTRACT

A three-dimensional semiconductor device includes an alternating stack of insulating layers and electrically conductive layers located over a substrate, memory stack structures extending through the alternating stack and arranged in at least five rows that extend along a first horizontal direction, contact via structures arranged in a same number of rows as the memory stack structures and overlying the memory stack structures, each of the contact via structures being electrically connected to a semiconductor channel of a respective memory stack structure, bit lines contacting a respective contact via structure and extending along a second horizontal direction that is different from the first horizontal direction, and a pair of wall-shaped via structures extending through the alternating stack and laterally extending along the first horizontal direction.

9 Claims, 14 Drawing Sheets

Related U.S. Application Data

(60) Provisional application No. 62/248,373, filed on Oct. 30, 2015.

(51) Int. Cl.
*H01L 27/11519* (2017.01)
*H01L 27/11556* (2017.01)
*H01L 27/11565* (2017.01)
*H01L 27/11582* (2017.01)

(52) U.S. Cl.
CPC .. *H01L 27/11519* (2013.01); *H01L 27/11565* (2013.01); *H01L 27/11582* (2013.01)

(58) Field of Classification Search
CPC ............ H01L 21/76877; H01L 23/528; H01L 21/02381; H01L 21/7682; H01L 29/7827; H01L 29/42332
USPC .................. 257/331, 314; 438/478, 702, 268
See application file for complete search history.

(56) References Cited

U.S. PATENT DOCUMENTS

| | | |
|---|---|---|
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,349,681 B2 | 1/2013 | Alsmeier et al. |
| 8,658,499 B2 | 2/2014 | Makala et al. |
| 9,023,719 B2 | 5/2015 | Pachamuthu et al. |
| 9,142,538 B1 | 9/2015 | Chen |
| 9,177,966 B1 | 11/2015 | Rabkin et al. |
| 2007/0210338 A1 | 9/2007 | Orlowski |
| 2007/0252201 A1 | 11/2007 | Kito et al. |
| 2009/0108333 A1 | 4/2009 | Kito et al. |
| 2009/0242967 A1 | 10/2009 | Katsumata et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0198687 A1 | 8/2011 | Lee |
| 2011/0266606 A1 | 11/2011 | Park et al. |
| 2011/0280077 A1 | 11/2011 | Fishburn |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0092926 A1 | 4/2012 | Whang |
| 2012/0146122 A1 | 6/2012 | Whang et al. |
| 2012/0276719 A1 | 11/2012 | Han et al. |
| 2013/0264631 A1 | 10/2013 | Alsmeier et al. |
| 2013/0270631 A1 | 10/2013 | Kim et al. |
| 2013/0313627 A1 | 11/2013 | Lee et al. |
| 2014/0138760 A1 | 5/2014 | Makala et al. |
| 2014/0273373 A1 | 9/2014 | Makala et al. |
| 2015/0076584 A1 | 3/2015 | Pachamuthu et al. |
| 2015/0109862 A1 | 4/2015 | Shibata et al. |
| 2015/0179660 A1* | 6/2015 | Yada ................. H01L 21/02164 257/321 |
| 2015/0206896 A1* | 7/2015 | Chen ................. H01L 27/11582 257/314 |
| 2015/0206898 A1 | 7/2015 | Chen |
| 2016/0093635 A1 | 3/2016 | Rabkin et al. |
| 2017/0125433 A1 | 5/2017 | Ogawa et al. |

OTHER PUBLICATIONS

Chen et al., "Reliability Characteristics of NiSi Nanocrystals Embedded in Oxide and Nitride Layers for Nonvolatile Memory Application," Applied Physics Letters, 92, 152114 (2008).
Diaz, "Low-k Dielectrics: Materials and Process Technology," EE518, Penn State University, Apr. 13, 2006.
Endoh et al., "Novel Ultra High Density Memory with a Stacked-Surrounding Gate Transistor (S-SGT) Structured Cell," IEDM Proc. (2001) pp. 33-36.
International Search Report and Written Opinion for PCT/US2015/0049597, dated Apr. 8, 2016, 17 pages.
International Search Report and Written Opinion, International Application No. PCT/US2011/042566, dated Jan. 17, 2012.
International Search Report and Written Opinion, International Application No. PCT/US2013/048508, dated Dec. 18, 2013.
International Search Report and Written Opinion, International Application No. PCT/US2016/049763, dated Jan. 18, 2017, 18pgs.
Invitation to Pay Additional Fees & Partial International Search Report, PCT/US2011/042566, dated Sep. 28, 2011.
Invitation to Pay Additional Search Fees, International Application No. PCT/2013/048508, dated Sep. 18, 2013.
International Application No. PCT/US2016/049763, Invitation to Pay Additional Fees and Communication, dated Nov. 17, 2016, 7pgs.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, M., "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Saraswat, "Low-k Dieletrics," Department of Electrical Engineering, Stanford University, Jul. 2008.
Tanaka et al., "Bit-Cost Scalable Technology for Low-Cost and Ultrahigh-Density Flash Memory," Toshiba Review, vol. 63, No. 2, 2008, pp. 28-31.
Office Communication, Notice of Reasons for Rejection (Non-Final Office Action), from Japan Patent Office for Japanese Patent Application No. 2018-514395, dated Sep. 11, 2018, 3 pages.
International Preliminary Report on Patentability from the International Bureau for International Patent Application No. PCT/US2016/049763, dated May 11, 2018, 14 pages.

* cited by examiner

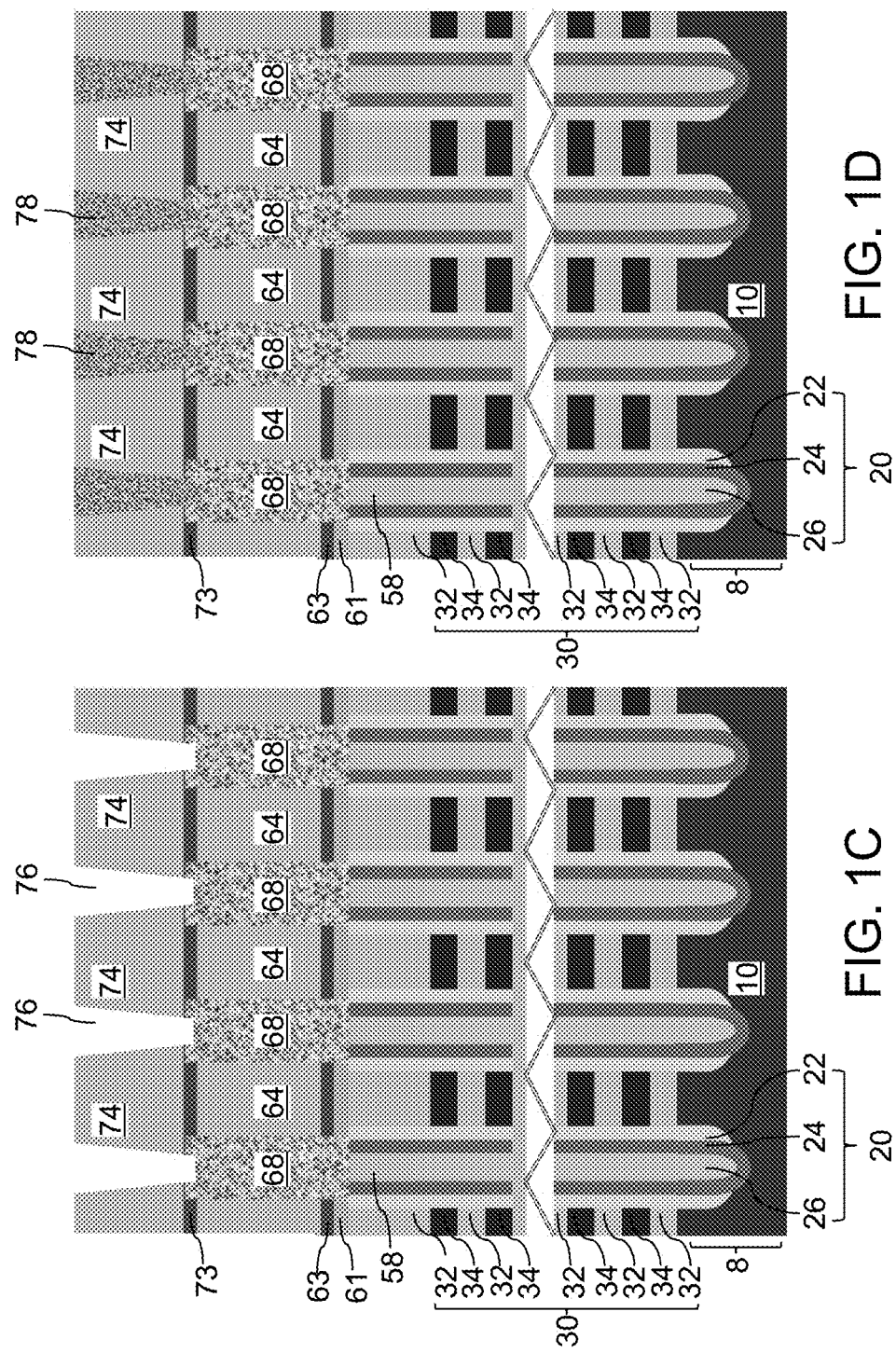

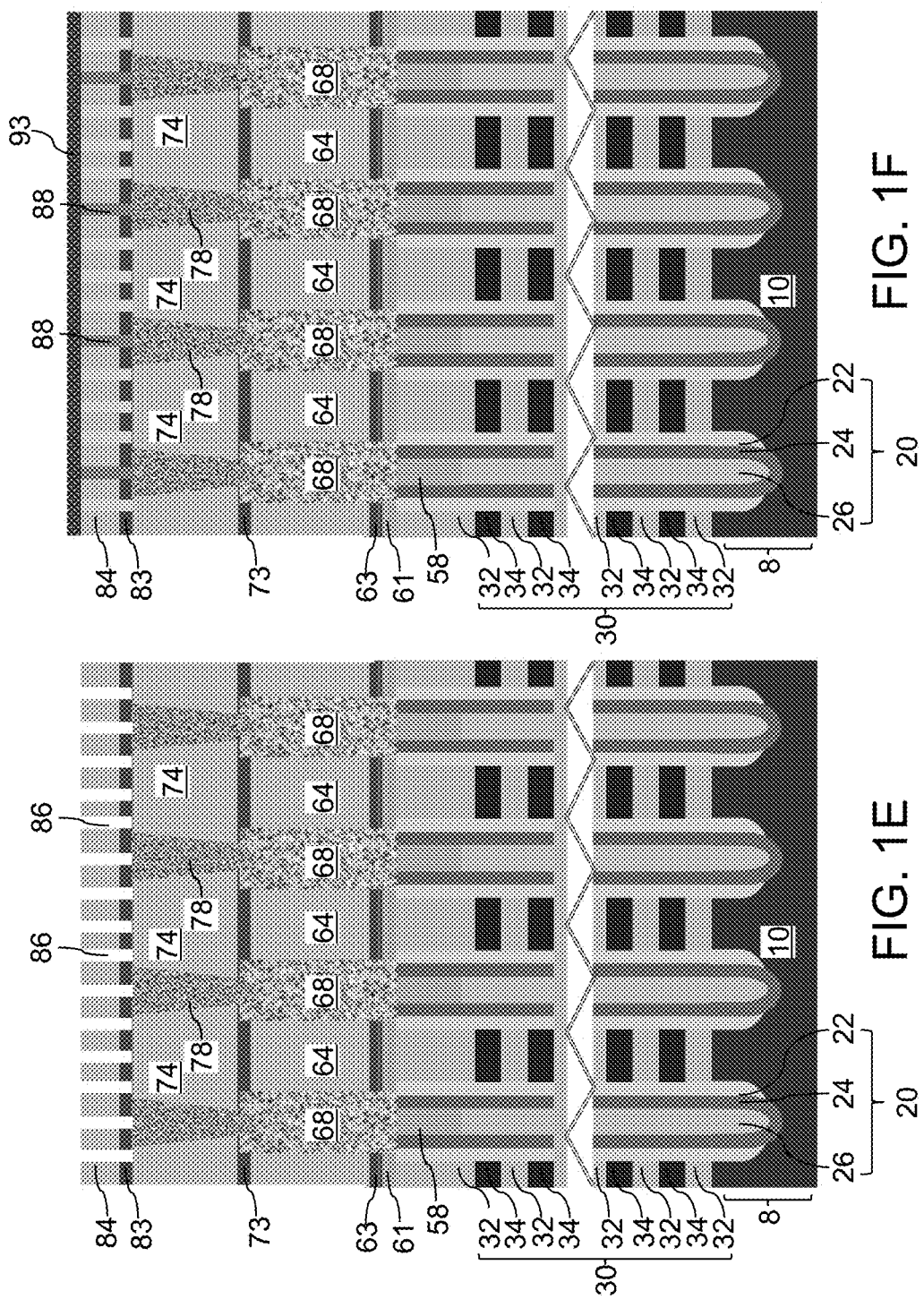

US 10,403,632 B2

3D NAND DEVICE WITH FIVE-FOLDED MEMORY STACK STRUCTURE CONFIGURATION

FIELD

The present disclosure relates to the field of semiconductor devices, and specifically to three-dimensional semiconductor devices, such as vertical NAND strings and other three-dimensional devices, and methods of making the same.

BACKGROUND

Recently, ultra high density storage devices have been proposed using a three-dimensional (3D) stacked memory structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a three-dimensional semiconductor device comprises an alternating stack of insulating layers and electrically conductive layers located over a substrate, memory stack structures extending through the alternating stack and arranged in at least five rows that extend along a first horizontal direction, contact via structures arranged in a same number of rows as the memory stack structures and overlying the memory stack structures, each of the contact via structures being electrically connected to a semiconductor channel of a respective memory stack structure, bit lines contacting a respective contact via structure and extending along a second horizontal direction that is different from the first horizontal direction, and arranged as a periodic array of bit lines having a bit line pitch along the first horizontal direction, and a pair of wall-shaped via structures extending through the alternating stack, and laterally extending along the first horizontal direction, wherein the at least five rows of memory stack structures are located between pair of wall-shaped via structures. In one embodiment, a geometrical center of each contact via structure is laterally offset along the first horizontal direction from a geometrical center of each contact via structure in any adjacent row of the contact via structures by at least twice the bit line pitch.

According to another aspect of the present disclosure, a three-dimensional semiconductor device comprises an alternating stack of insulating layers and electrically conductive layers located over a substrate, memory stack structures extending through the alternating stack and arranged in a first two-dimensional hexagonal array including at least five rows that extend along the first horizontal direction, and contact pillars arranged in a same number of rows as the memory stack structures and overlying the memory stack structures, each of the contact pillars being electrically connected to a semiconductor channel of a respective memory stack structure. A first subset of contact pillars including contact pillars located between outermost rows is arranged in a second two-dimensional hexagonal array that is commensurate with a portion of the first two-dimensional hexagonal array. A geometrical center of each contact pillar in a second subset of contact pillars including contact pillars located at the outermost rows is laterally offset from an axis passing through a geometrical center of a respective underlying memory stack structure.

According to another aspect of the present disclosure a three-dimensional NAND device comprises an alternating stack of word lines separated by insulator layers extending in a word line direction, at least five rows of memory holes each containing a vertical semiconductor channel and a memory film, the rows extending in the word line direction between a pair of adjacent slit trenches, and a plurality of bit lines extending in a bit line direction and electrically connected to the semiconductor channels. In one embodiment, adjacent bit lines are not electrically connected to semiconductor channels in nearest neighbor memory holes.

BRIEF DESCRIPTION OF THE DRAWINGS

FIGS. 1A-1F are sequential vertical cross-sectional views of a exemplary structure containing a NAND string at various steps for forming an overlying metal interconnect structure according to an embodiment of the present disclosure.

DETAILED DESCRIPTION

As discussed above, the present disclosure is directed to three-dimensional semiconductor devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory stack structures. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

The drain regions of the memory cells are connected to bit lines through contact via structures. The present inventors realized that capacitive coupling between the bit lines and the contact via structures contributes to the total parasitic capacitance of the bit lines. The greater the capacitive coupling between the bit lines and the contact via structures to the drain regions, the greater the parasitic capacitance of the bit lines and the RC delay of the bit lines. Further, the present inventors realized that the parasitic capacitance can be reduced by forming low dielectric constant dielectric materials, a vacuum cavity, or an air cavity over the contact via structures.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

Figure 1A:
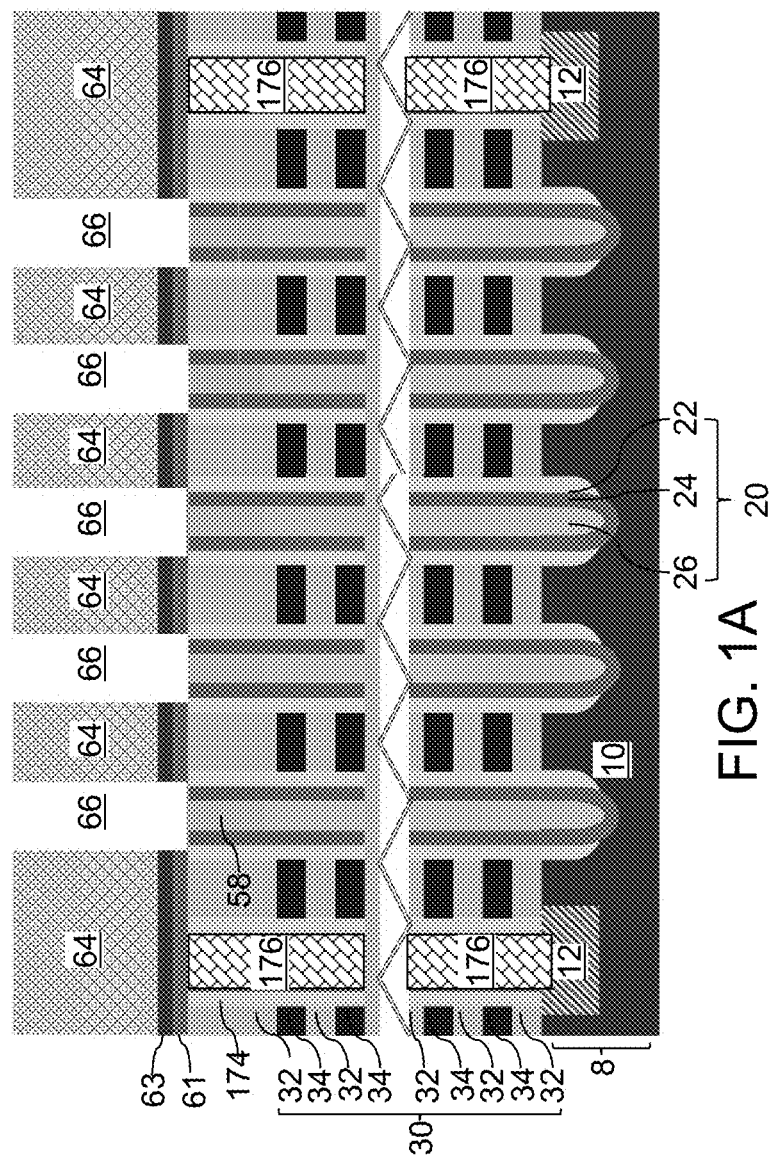

The various three dimensional memory devices of the present disclosure include a monolithic three-dimensional NAND string memory device, and can be fabricated employing the various embodiments described herein. Referring to FIG. 1A, a first exemplary structure according to a first embodiment of the present disclosure includes a first exemplary structure, which includes a three-dimensional semiconductor device. Specifically, the three-dimensional semiconductor device can contain a monolithic, three-dimensional array of NAND strings that includes a monolithic three-dimensional NAND string located over a substrate 8.

The substrate 8 can include a substrate semiconductor layer 10. In one embodiment, the substrate 8 can be a silicon substrate. Optionally, additional material layers (not shown) may be present underneath the substrate 8. The substrate 8 can be a bulk semiconductor substrate, in which case the entirety of the substrate 8 is a semiconductor substrate. Alternatively, the substrate 8 can be a top semiconductor layer of a semiconductor-on-insulator (SOI) substrate or a top semiconductor material portion a hybrid substrate including at least one bulk semiconductor region and at least one SOI region. In this case, the substrate semiconductor layer 10 can be the top semiconductor layer of an SOI substrate, a semiconductor material layer in a bulk portion, or a top semiconductor portion of in an SOI region of a hybrid substrate.

The substrate semiconductor layer 10 is a semiconductor material layer, and can include at least one elemental semiconductor material (such as silicon), at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having a resistivity in the range from $1.0 \times 10^{-5}$ Ohm-cm to $1.0 \times 10^5$ Ohm-cm, and is capable of producing a doped material having a resistivity in a range from $1.0 \times 10^{-5}$ Ohm-cm to 1.0 Ohm-cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "major surface" refers to a planar surface having a greater area than at least another surface that may be another planar surface or a curved surface. As used herein, a planar surface is a surface that is contained within a Euclidean two-dimensional plane or deviating from a Euclidean two-dimensional plane only by variations caused by surface bowing and/or surface roughness of a magnitude inherently present in commercially available semiconductor substrates.

The substrate semiconductor layer 10 can include a single crystalline semiconductor material, a polycrystalline semiconductor material, and/or an amorphous semiconductor material. In one embodiment, the substrate semiconductor layer 10 can be a single crystalline semiconductor material layer. In one embodiment, the substrate semiconductor layer 10 can include a single crystalline silicon layer, a single crystalline silicon-germanium alloy layer, or a single crystalline silicon-carbon alloy layer. Alternately or additionally, the substrate semiconductor layer 10 can include a polycrystalline silicon layer, a polycrystalline silicon-germanium alloy layer, or a polycrystalline silicon-carbon alloy layer. Portions of the substrate semiconductor layer 10 can be suitably doped with p-type dopants or n-type dopants.

Source regions or drain regions can be formed as doped portions of the substrate semiconductor layer 10, i.e., by doping portions of the substrate semiconductor layer 10 with p-type dopants or n-type dopants. In one embodiment, the doped regions can be formed as source regions for monolithic three-dimensional NAND string memory devices. Each memory stack structure 20 includes memory cells embedded within an alternating stack 30 of insulator layers 32 and electrically conductive layers 34, which can be control gate electrodes for the monolithic three-dimensional NAND string memory devices.

Optionally, select gate electrodes such as source-side select gate electrodes (not shown) can be formed within, or on top of, the substrate semiconductor layer 10 employing any suitable material. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

The alternating stack 30 includes alternately stacked insulator layers 32 and electrically conductive layers 34. The insulator layers 32 include a first material, which is an electrically insulating material (e.g., interlevel insulating material). The electrically conductive layers 34 include a second material, which is a conductive material. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides, dielectric metal oxynitrides, low dielectric constant dielectric materials such as organosilicate glass, dielectric oxides (e.g., aluminum oxide, hafnium oxide, etc.) and silicates thereof, and organic insulating materials. Conductive materials that can be employed for the electrically conductive layers 34 include, but are not limited to, a doped semiconductor material, elemental metals, intermetallic alloys, conductive nitrides of at least one elemental metal, a silicate of at least one metal, conductive carbon allotropes, organic conductive materials, and combinations thereof. For example, the second material of the electrically conductive layers 34 can be doped polysilicon, tungsten, tungsten nitride, tantalum, tantalum nitride, titanium, titanium nitride, cobalt, copper, aluminum, an alloy thereof, or a combination thereof.

In one embodiment, the insulator layers 32 can include silicon oxide or organosilicate glass, and the electrically conductive layers 34 can include doped polysilicon or doped amorphous silicon that can be subsequently converted into doped polysilicon through a thermal anneal at an elevated temperature. The first material of the insulator layers 32 can be deposited, for example, by chemical vapor deposition (CVD). For example, if undoped silicate glass or doped silicate glass is employed for the insulator layers 32, tetraethyl orthosilicate (TEOS) can be employed as the precursor material for the CVD process. The second material of the electrically conductive layers 34 can be deposited, for example, by physical vapor deposition (PVD; sputtering), chemical vapor deposition, electroplating, electroless plating, or combinations thereof. Alternatively, the second material of the electrically conductive layers 34 can be deposited by formation of an alternating stack of the insulator layers 32 and sacrificial material layers (e.g., silicon nitride layers or polysilicon layers), selective removal of the sacrificial material layer with respect to the insulator layers 32 to form lateral recesses, and deposition of a conductive material within the recesses, for example, by chemical vapor deposition. As used herein, "selective removal" of a first material with respect to a second material refers to removal of the first material selective to the second material. As used herein, removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The electrically conductive layers 34 can be suitably patterned to function as the control gate electrodes of the monolithic three-dimensional NAND string memory devices to be subsequently formed. The electrically conductive layers 34 may comprise a portion having a strip shape extending substantially parallel to the major surface 9 of the substrate 8.

The thicknesses of the insulator layers 32 and the electrically conductive layers 34 can be in a range from 15 nm to 100 nm, although lesser and greater thicknesses can be employed for each insulator layer 32 and for each electrically conductive layer 34. The topmost layer among the insulator layers 32 may have a greater thickness than underlying insulator layers 32. The number of repetitions of the pairs of an insulator layer 32 and an electrically conductive layer 34 can be in a range from 2 to 1,024, and typically from 8 to 256, although a greater number of repetitions can also be employed.

An array of memory openings can be formed through the alternating stack 30 by a combination of lithographic methods and at least one anisotropic etch. For example, a photoresist layer (not shown) can be formed over the alternating stack 30 and lithographically patterned to form a plurality of openings therein by lithographic exposure and development. The pattern in the photoresist layer can be transferred through the alternating stack 30 and optionally into an upper portion of the substrate semiconductor layer 10 by at least one anisotropic etch to form an array of memory opening, i.e., openings that are subsequently employed to form an array of memory elements. The chemistry of the anisotropic etch process employed to etch through the materials of the alternating stack 30 can alternate to optimize etching of the first and second materials in the alternating stack 30. The anisotropic etch can be, for example, a series of reactive ion etches. Optionally, a sacrificial etch stop layer (not shown) may be employed between the alternating stack 30 and the substrate 8. The sidewalls of the memory openings can be substantially vertical, or can be tapered.

In one embodiment, an overetch into the substrate semiconductor layer 10 can be optionally performed after the top surfaces of the substrate semiconductor layer 10 are physically exposed. The overetch can form recesses underneath the memory holes from a horizontal plane including the major surface 9 of the substrate 8, i.e., from the top surface of the substrate semiconductor layer 10. The recess depth can be, for example, in a range from 1 nm to 50 nm, although lesser and greater recess depths can also be employed. The overetch is optional, and may be omitted.

Each of the memory openings can include a sidewall (or a plurality of sidewalls) that extends substantially perpendicular to the major surface 9 of the substrate 8, and is defined by the physically exposed sidewall surfaces of the alternating stack 30. In one embodiment, the sidewalls of the recessed portions of the substrate semiconductor layer 10 can be vertically coincident with the sidewalls of the memory openings. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

A memory film layer, a semiconductor channel layer, and optionally, a dielectric fill material layer can be sequentially deposited in the memory openings and over the alternating stack 30. The memory film layer can include a stack, from one side to another, of a blocking dielectric layer, a charge storage layer, and a tunnel dielectric layer. Thus, the blocking dielectric layer, the charge storage layer, the tunnel dielectric layer, the semiconductor channel layer, and the optional dielectric fill material layer can be sequentially deposited to fill the memory holes.

The blocking dielectric layer may include one or more dielectric material layers that can function as the dielectric material(s) of a control gate dielectric between the electrically conductive layers 34 and charge storage regions to be subsequently formed out of the charge storage layer. The blocking dielectric layer can include silicon oxide, a dielectric metal oxide, a dielectric metal oxynitride, or a combination thereof.

The charge storage layer includes a charge trapping material, which can be, for example, silicon nitride or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials and/or semiconductor materials. Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitrides, dielectric metal oxides (such as aluminum oxide and hafnium oxide), dielectric metal oxynitrides, dielectric metal silicates, alloys thereof, and/or combinations thereof.

The semiconductor channel layer includes a polycrystalline semiconductor material or an amorphous semiconductor material that can be subsequently annealed at an elevated temperature to form a polycrystalline semiconductor material. Semiconductor materials that can be employed for the semiconductor channel layer include, but are not limited to, silicon, germanium, a silicon-germanium alloy, a silicon-carbon alloy, a silicon-germanium-carbon alloy, a III-V compound semiconductor material, a II-VI compound semiconductor material, an organic semiconductor material, or a combination thereof. The semiconductor channel layer can be formed by a conformal deposition process such as chemical vapor deposition (CVD) or atomic layer deposition (ALD). The thickness of the semiconductor channel layer can be in a range from 3 nm to 30 nm, although lesser and greater thicknesses can also be employed. The semiconductor channel layer can include a doped semiconductor material. The doped semiconductor material can be p-doped or n-doped, i.e., doped with p-type electrical dopants or n-type electrical dopants.

Optionally, the dielectric fill material layer includes a dielectric material such as silicon oxide, organosilicate glass (OSG), a spin-on dielectric material, a low-k dielectric material having a dielectric constant less than 3.0, or a combination thereof. In one embodiment, the dielectric fill material layer includes undoped silicon oxide. The dielectric fill material layer can be deposited, for example, by chemical vapor deposition and/or by spin coating. The amount of the deposited dielectric material for the dielectric fill material layer is selected such that the entire cavity of each memory opening is filled with the deposited dielectric material.

Portions of the blocking dielectric layer, the memory film layer, and the optional dielectric fill material layer can be removed above the top surface of the alternating stack 30, for example, by chemical mechanical planarization (CMP), a recess etch, or a combination thereof. Each remaining portion of the memory film layer within a memory hole constitutes a memory film 22. Each remaining portion of the semiconductor channel layer in a memory opening constitutes a vertical semiconductor channel 24. Each remaining portion of the dielectric fill material layer within a memory hole constitutes a dielectric core 26. An adjoining set of a memory film 22, a vertical semiconductor channel 24, and a dielectric core 26 collectively constitutes a memory stack structure 20, which is a vertical column of memory elements. As used herein, a memory element is a structure capable of storing information for a memory bit (a "0" or "1"). In one embodiment, a section of a memory film 22 and a section of a vertical semiconductor channel 24 within one level in proximity to a control gate electrode located at one level, in conjunction with the control gate electrode, constitute a memory element or a "memory cell." A vertical stack of memory elements constitutes a memory stack structure 20, which is a memory stack structure. In one embodiment, the array of memory stack structures 20 can be an array of NAND strings.

Top portions of the dielectric cores 26 can be recessed to form cavities by an etch that is selective to the dielectric material of the topmost insulator layer 32. In one embodiment, the etch can be selective to the vertical semiconductor channels 24. A doped semiconductor material portion is formed within each cavity to form drain regions 58. Each drain region 58 contacts a vertical semiconductor channel 24. The vertical semiconductor channels 24 can be intrinsic or doped. If the vertical semiconductor channels 24 are doped, the source regions (not shown) in the substrate semiconductor layer 10 and the drain regions 58 within the memory openings can have a conductivity type that is the opposite of the conductivity type of the vertical semiconductor channels 24. For example, if the vertical semiconductor channels 24 include a p-doped semiconductor material, the source regions and the drain regions 58 can have n-doped semiconductor materials. If the vertical semiconductor channels 24 include an n-doped semiconductor material, the source regions and the drain regions 58 can have p-doped semiconductor materials. Alternately, the source regions (not shown) in the substrate semiconductor layer 10 and the drain regions 58 within the memory openings can have the same conductivity type as the vertical semiconductor channels 24. In one embodiment, the topmost surface of each drain region 58 can be coplanar with the top surface of the topmost insulator layer 32. The bottommost surface of each drain region 58 can be located above a horizontal plane including the bottommost surface of topmost insulator layer 32.

The first exemplary structure contains a three-dimensional semiconductor device including an array of unit device structures over a substrate 8. Each of the unit device structures can include a memory stack structure 20 and a drain region 58. Each memory stack structure 20 includes a vertical semiconductor channel 24 having at least a portion extending along a vertical direction perpendicular to a top surface of the substrate 8. Each drain region 58 contacts a top end of the vertical semiconductor channel 24. The three-dimensional semiconductor device further comprises an alternating stack 30 of insulator layers 32 and electrically conductive layers 34 (which can be control gate electrodes) that laterally surround the plurality of memory stack structures 20.

In one embodiment, the substrate 8 can comprise a silicon substrate, and the three-dimensional semiconductor device can comprise a monolithic, three-dimensional array of NAND strings that includes a monolithic three-dimensional NAND string located over the silicon substrate. For example, at least one memory cell that is located in a first device level of the three-dimensional array of NAND strings can be located over another memory cell in a second device level of the three-dimensional array of NAND strings. The silicon substrate can contain an integrated circuit comprising a driver circuit for the at least one memory cell.

Backside trenches extending through the alternating stack 30 can be provided to form respective wall-shaped via structures 176 therein. Each backside trench can have a uniform width and can laterally extend along a first horizontal direction. Thus, each wall-shaped via structure 176 can have a form of a plate having a substantially uniform thickness that is invariant along the first horizontal direction. Each wall-shaped via structure 176 can have a vertical sidewall, or can have a taper along the vertical direction. A source region 12 can be formed at the bottom of each backside trench. In one embodiment, the source regions 12 can have the same conductivity type as the drain regions 58. In one embodiment, the source regions 12 and the drain regions 58 can be p-doped regions. In another embodiment, the source regions 12 and the drain regions 58 can be n-doped regions. A semiconductor channel is provided between each drain region 58 and an adjacent source region 12. Each semiconductor channel includes a vertical semiconductor channel 24 and a horizontal semiconductor channel that is a portion of the substrate semiconductor layer 10 between a bottommost portion of the vertical semiconductor channel 24 and the adjacent source region 12.

An insulating spacer 174 can be formed within each backside trench, for example, by conformal deposition of an insulating material layer and an anisotropic etch. Each remaining portion of the conformal insulating material layer at a periphery of the respective backside trench constitutes an insulating spacer 174. At least one conductive material is deposited into remaining volumes of the backside trenches to form backside contact via structures 176, which can contact the respective source regions 12. Each backside contact via structure 176 can laterally extend along the first horizontal direction. The memory stack structures 20 can be arranged in groups that are located between adjacent pairs of backside contact via structures 176. Thus, a group of memory stack structures 20 can be provided between each adjacent pair of backside contact via structures 176.

Each group of memory stack structures 20 between an adjacent pair of backside contact via structures 176 can be arranged in an array configuration. In one embodiment, each group of memory stack structures 20 between an adjacent pair of backside contact via structures 176 can be arranged as rows of memory stack structures 20 that are periodically positioned along the first lengthwise direction. In one embodiment, the rows of memory stack structures 20 can have a uniform pitch along a second horizontal direction, which can be perpendicular to the first horizontal direction. In one embodiment, the rows of memory stack structures 20 can form a hexagonal periodic array such that the axis of each memory stack structure 20 (i.e., a vertical line that passes through the geometrical center of the respective memory stack structure 20) are at vertices of a hexagonal array in a plan view (i.e., as viewed top-down). In one embodiment, the number of rows of the memory stack structures 20 between each adjoining pair of wall-shaped via structures 176 can be 4, 5, 6, 7, 8, 9, 10, 11, or 12. In one embodiment, the number of rows of the memory stack structures 20 between each adjoining pair of wall-shaped via structures 176 can be 5 to provide advantage in avoiding electrical shorts, which is described below.

An overlying metal interconnect structure can be formed over the array of memory stack structures 20. For example, at least one dielectric material layer can be optionally formed over the top surfaces of the alternating stack 30 and the array of memory stack structures 20. The at least one dielectric material layer deposited on the top surface of the alternating stack is herein referred to as at least one pillar-level dielectric cap layer (61, 63). Each of the at least one pillar-level dielectric cap layer (61, 63) is a dielectric material layer that is formed at the pillar level. As used herein, a "pillar level" refers to a level including contact pillars that contact the drains 58 of the memory stack structures 20. As used herein, a "pillar-level" element refers to an element that is formed at the location of the pillar level. The at least one pillar-level dielectric cap layer (61, 63) functions as at least one cap layer that covers the entirety of the alternating stack 30, the array of memory stack structures 20, and the drain regions 58. Each of the at least one pillar-level dielectric cap layer (61, 63) is a dielectric material layer that is present at the pillar level. Alternatively, the at least one pillar-level dielectric cap layer (61, 63) may be omitted.

In one embodiment, the at least one pillar-level dielectric cap layer (61, 63) can include a first pillar-level dielectric cap layer 61 containing a first dielectric material and a second pillar-level dielectric cap layer 63 containing a second dielectric material. At least one of the first and second dielectric materials can be selected to be an etch stop material during a subsequent process that removes a sacrificial dielectric layer from above the second dielectric material. In one embodiment, the first dielectric material can be silicon oxide or organosilicate glass (OSG), and the second dielectric material can be silicon nitride or nitrogen-doped organosilicate glass. In one embodiment, each of the first and second pillar-level dielectric cap layers (61, 63) can have a thickness in a range from 3 nm to 60 nm, although lesser and greater thicknesses can also be employed.

A dielectric material layer is formed over the first and second pillar-level dielectric cap layers (61, 63). The dielectric material layer is herein referred to as a pillar-level dielectric material layer 64. The pillar-level dielectric material layer 64 can be formed over the at least one pillar level dielectric cap layer (61, 63) or over the alternating stack 30 in case the at least one pillar level dielectric cap layer (61, 63) is not present. The pillar-level dielectric material layer 64 can be formed by chemical vapor deposition or spin coating. The thickness of the pillar-level dielectric material layer 64 can be in a range from 200 nm to 1,000 nm, although lesser and greater thicknesses can also be employed.

In one embodiment, the pillar-level dielectric material layer can have a dielectric material having a dielectric constant in a range from 3.0 to 3.9 such as silicon oxide based dielectric material. Exemplary dielectric materials having a dielectric constant in a range from 3.0 to 3.9 include undoped silicate glass and various doped silicate glasses. In one embodiment, the pillar-level dielectric material layer 64 can have a dielectric constant less than 3.0. In one embodiment, low-k dielectric material of the pillar-level dielectric material layer 64 can be a material selected from fluorinated glass, hydrogen silsesquioxane, alkyl silsesquioxane, a spin-on aromatic polymer, polyimide, fluorinated polyimide, doped or undoped parylene, a B-stage polymer, doped or undoped diamond-like carbon, diamond-like carbon, doped or undoped amorphous carbon, polytetrafluoroethylene (PTFE), xerogel, aerogel, and porous variants thereof.

Subsequently, a photoresist layer (not shown), and optionally an antireflective coating layer (not shown), can be formed over the top surface of the pillar-level dielectric material layer 64, and is lithographically patterned to form an array of openings therein. The pattern of the openings can be substantially the same as the pattern of contact pillars to be subsequently formed. The pattern in the photoresist layer is transferred through the pillar-level dielectric material layer 64 and the at least one pillar-level dielectric cap layer (61, 63), if present, to form a plurality of pillar cavities 66.

Figure 1B:
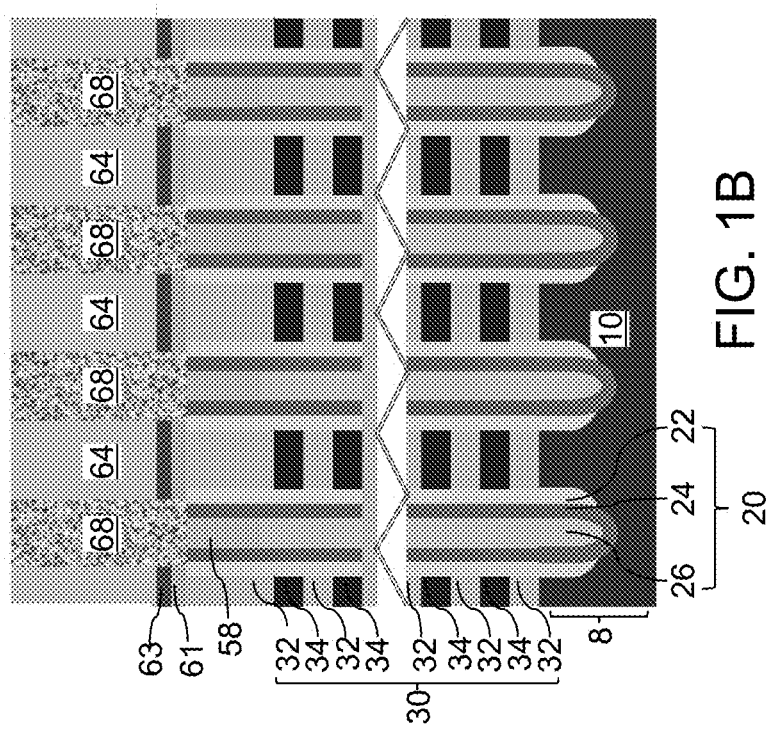

Referring to FIG. 1B, a plurality of contact pillars 68 can be formed within the plurality of pillar cavities 66 by depositing a conductive material within the pillar cavities 66 and over the top surface of the pillar-level dielectric material layer 64, and subsequently removing the portion of the deposited conductive material from above the top surface of the pillar-level dielectric material layer 64. The same conductive material can be employed to form the plurality of contact pillars 68 as in the first and second embodiments of the present disclosure. Further, the same method can be employed to deposit and planarize the conductive material as in the first and second embodiments of the present disclosure. The plurality of conductive pillars 68 can be formed through the pillar-level dielectric material layer 64 and at least one pillar-level dielectric cap layer (61, 63), if present, and directly on the drain regions 58. Each of the plurality of contact pillars 68 can have a horizontal cross-sectional shape that is invariant under translation along the vertical direction. In one embodiment, each of the plurality of contact pillars 68 can have a substantially cylindrical shape. Alternatively, the plurality of contact pillars 68 can have shapes of inverted frustums.

A pillar-level structure is formed, which includes a plurality of contact pillars 68 and a contiguous volume of a homogeneous composition filled by the pillar-level dielectric material layer 64. The pillar-level dielectric material layer 64 laterally surrounds the plurality of contact pillars 68, which is contact with the drain regions 58. The contiguous volume of the pillar-level dielectric material layer 64 is located above the topmost surface of at least one pillar-level dielectric cap layer (61, 63) contacting bottom portions of the plurality of contact pillars 68. The dielectric constant of the contiguous volume (which may, or may not, have a homogeneous composition), i.e., of the pillar-level dielectric material layer 64, can be equal to, or less than, 3.9. In one embodiment, the dielectric constant of the pillar-level dielectric material layer 64 can be less than 3.0 The contiguous volume of the homogeneous composition can comprise a remaining portion of the pillar-level dielectric material layer 64 after formation of the plurality of pillars 68.

If the pillar-level dielectric material layer 64 includes undoped silicate glass, the dielectric constant of the pillar-level dielectric material layer 64 can be about 3.9. If the pillar-level dielectric material layer 64 includes fluorinated glass, the dielectric constant of the pillar-level dielectric material layer 64 can be about 2.8. If the pillar-level dielectric material layer 64 includes silsesquioxane or alkyl silsesquioxane, the dielectric constant of the pillar-level dielectric material layer 64 can be about 2.7. If the pillar-level dielectric material layer 64 includes a spin-on aromatic polymer, the dielectric constant of the pillar-level dielectric material layer 64 can be about 2.0. If the pillar-level dielectric material layer 64 includes polyimide, the dielectric constant of the pillar-level dielectric material layer 64 can be about 2.9. If the pillar-level dielectric material layer 64 includes fluorinated polyimide, the dielectric constant of the pillar-level dielectric material layer 64 can be about 2.3. If the pillar-level dielectric material layer 64 includes doped or undoped parylene, the dielectric constant of the pillar-level dielectric material layer 64 can be about 2.7. If the pillar-level dielectric material layer 64 includes a B-stage polymer, the dielectric constant of the pillar-level dielectric material layer 64 can be about 2.6. If the pillar-level dielectric material layer 64 includes doped or undoped diamond-like carbon, diamond-like carbon, or doped or undoped amorphous carbon, the dielectric constant of the pillar-level dielectric material layer 64 can be about 2.7. If the pillar-level dielectric material layer 64 includes polytetrafluoroethylene (PTFE), the dielectric constant of the pillar-level dielectric material layer 64 can be about 1.9. If the pillar-level dielectric material layer 64 includes a highly porous dielectric oxide material such as xerogel or aerogel, the dielectric constant of the pillar-level dielectric material layer 64 can be from about 1.8 to about 2.5. Porous version of any non-porous dielectric material generally provides a lower dielectric constant than the non-porous dielectric material.

Referring to FIG. 1C, a via-level dielectric cap layer 73 can be deposited over the top surface of the pillar-level dielectric material layer 64. The via-level dielectric cap layer 73 is a dielectric material layer that is formed in the via level, and can be employed as an etch stop layer during subsequent formation of via cavities. The via-level dielectric cap layer 73 can include silicon oxide, organosilicate glass (OSG), silicon nitride, nitrogen-doped organosilicate glass, or a stack thereof. In one embodiment, the via-level dielectric cap layer 73 can have a thickness in a range from 3 nm to 60 nm, although lesser and greater thicknesses can also be employed. The via-level dielectric cap layer 73 is a cover insulating layer, i.e., a dielectric material layer located in the via level. The contiguous bottom surface of the via-level dielectric cap layer 73 contacts a planar top surface of the pillar-level dielectric material layer 64.

A dielectric material layer can be formed over the via-level dielectric cap layer 73. The dielectric material layer can include a low dielectric constant material having a dielectric constant less than 3.9, which is the dielectric constant of silicon oxide. In this case, the dielectric material layer formed over the via-level dielectric cap layer 73 is herein referred to as a via-level dielectric material layer 74.

The via-level dielectric material layer 74 can have a dielectric constant less than 3.9. In one embodiment, the via-level dielectric material layer 74 can have a dielectric constant less than 3.0. In one embodiment, low-k dielectric material of the via-level dielectric material layer 74 can be selected from any dielectric material that can be employed for the low-k dielectric material of the pillar-level dielectric material layer 64.

A photoresist layer (not shown), and optionally an anti-reflective coating layer (not shown), can be formed over the top surface of the via-level dielectric material layer 74, and is lithographically patterned to form an array of openings therein. The pattern of the openings can be substantially the same as the pattern of contact via structures to be subsequently formed. The pattern in the photoresist layer is transferred through the via-level dielectric material layer 74 and the via-level dielectric cap layer 73 to form a plurality of via cavities 76. A top surface of a contact pillar 68 can be physically exposed at the bottom of each via cavity 76. In one embodiment, each of the plurality of via cavities 76 can have a tapered shape, or can have a substantially cylindrical shape. Alternatively, the plurality of via cavities 76 can have shapes of inverted frustums.

Referring to FIG. 1D, a plurality of contact via structures 78 can be formed within the plurality of via cavities 76. The plurality of contact via structures 78 can be formed on the top surfaces of the plurality of contact pillars 68 and through the via-level dielectric material layer 74 and the via-level dielectric cap layer 73. Each of the plurality of contact via structures 78 contacts a respective one of the plurality of contact pillars 68. The conductive materials that can be employed to form the plurality of contact via structures 78 can be the same as in the first and second embodiments. The deposition and planarization of the conductive material can be performed employing the same processing steps as in the first and second embodiments.

Referring to FIG. 1E, a line-level dielectric cap layer 83 can be deposited over the top surface of the via-level dielectric material layer 64. The line-level dielectric cap layer 83 is a dielectric material layer that is formed in the line level, and can be employed as an etch stop layer during subsequent formation of line cavities. The line-level dielectric cap layer 83 can include silicon oxide, organosilicate glass (OSG), silicon nitride, nitrogen-doped organosilicate glass, or a stack thereof. In one embodiment, the line-level dielectric cap layer 83 can have a thickness in a range from 3 nm to 60 nm, although lesser and greater thicknesses can also be employed. The line-level dielectric cap layer 83 is a line-level dielectric layer, i.e., a dielectric material layer located in the line level. The contiguous bottom surface of the line-level dielectric cap layer 83 contacts can contact a planar top surface of the via-level dielectric material layer 74.

A dielectric material layer can be formed over the line-level dielectric cap layer 83. The dielectric material layer can include a low dielectric constant material having a dielectric constant less than 3.9, which is the dielectric constant of silicon oxide. In this case, the dielectric material layer formed over the line-level dielectric cap layer 83 is herein referred to as a line-level low-k dielectric material layer 84.

The line-level low-k dielectric material layer 84 can have a dielectric constant less than 3.9. In one embodiment, the line-level low-k dielectric material layer 84 can have a dielectric constant less than 3.0. In one embodiment, low-k dielectric material of the line-level low-k dielectric material layer 84 can be selected from any dielectric material that can be employed for the low-k dielectric material of the pillar-level dielectric material layer 64 or the via-level dielectric material layer 74.

A photoresist layer (not shown), and optionally an antireflective coating layer (not shown), can be formed over the top surface of the line-level low-k dielectric material layer 84, and is lithographically patterned to form an array of openings therein. The pattern of the openings can be substantially the same as the pattern of bit lines to be subsequently formed. The pattern in the photoresist layer is transferred through the line-level low-k dielectric material layer 84 and the line-level dielectric cap layer 83 to form a plurality of line cavities 86. A top surface of a contact via structure 78 can be physically exposed at the bottom of each line cavity 86. In one embodiment, each of the plurality of line cavities 86 can have a substantially rectangular vertical cross-sectional shape.

Referring to FIG. 1F, a plurality of bit lines 88 can be formed within the plurality of line cavities 86. The plurality of bit lines 88 can be formed on the top surfaces of the plurality of contact via structures 78 and through the line-level low-k dielectric material layer 84 and the line-level dielectric cap layer 83. Each of the plurality of bit lines 88 contacts a respective one of the plurality of contact via structures 78. The plurality of bit lines 88 is formed on the topmost portions of the plurality of contact via structures 78. The plurality of bit lines 88 laterally extends along a same horizontal direction. The conductive material that fills the plurality of line cavities 86 can be the same as in the first embodiment.

A dielectric material can be conformally or non-conformally deposited over the plurality of bit lines 88 to form a capping dielectric layer 93. The capping dielectric layer 93 can include any of the dielectric material that can be employed for the at least one pillar-level dielectric cap layer (61, 63), the via-level dielectric cap layer 73, or the line-level dielectric cap layer 83. Methods employed for deposition of the at least one pillar-level dielectric cap layer (61, 63), the via-level dielectric cap layer 73, or the line-level dielectric cap layer 83 can be employed to form the capping dielectric layer 93. Alternatively, integrated line and via structures can be formed in lieu of each combination of a bit line 88 and at least one contact via structure 78 contacting the bit line 88.

Figure 2:
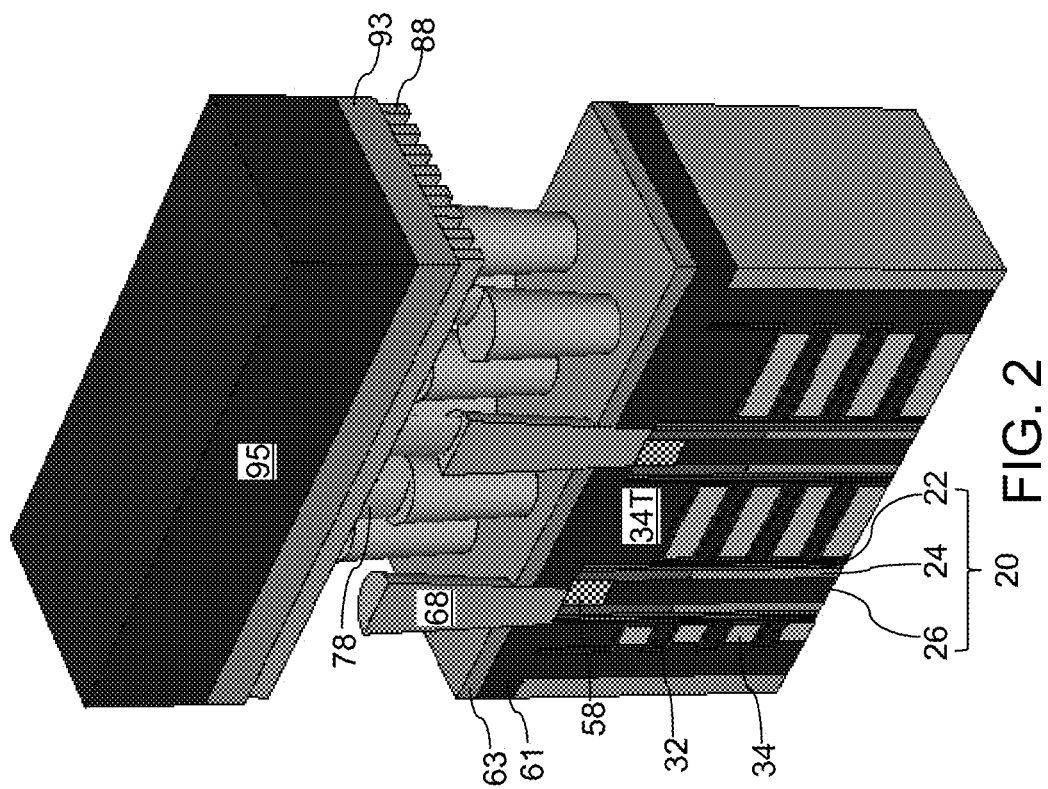
FIG. 2 is a perspective view of a cut-out portion of the exemplary structure according to an embodiment of the present disclosure.
Figure 3:
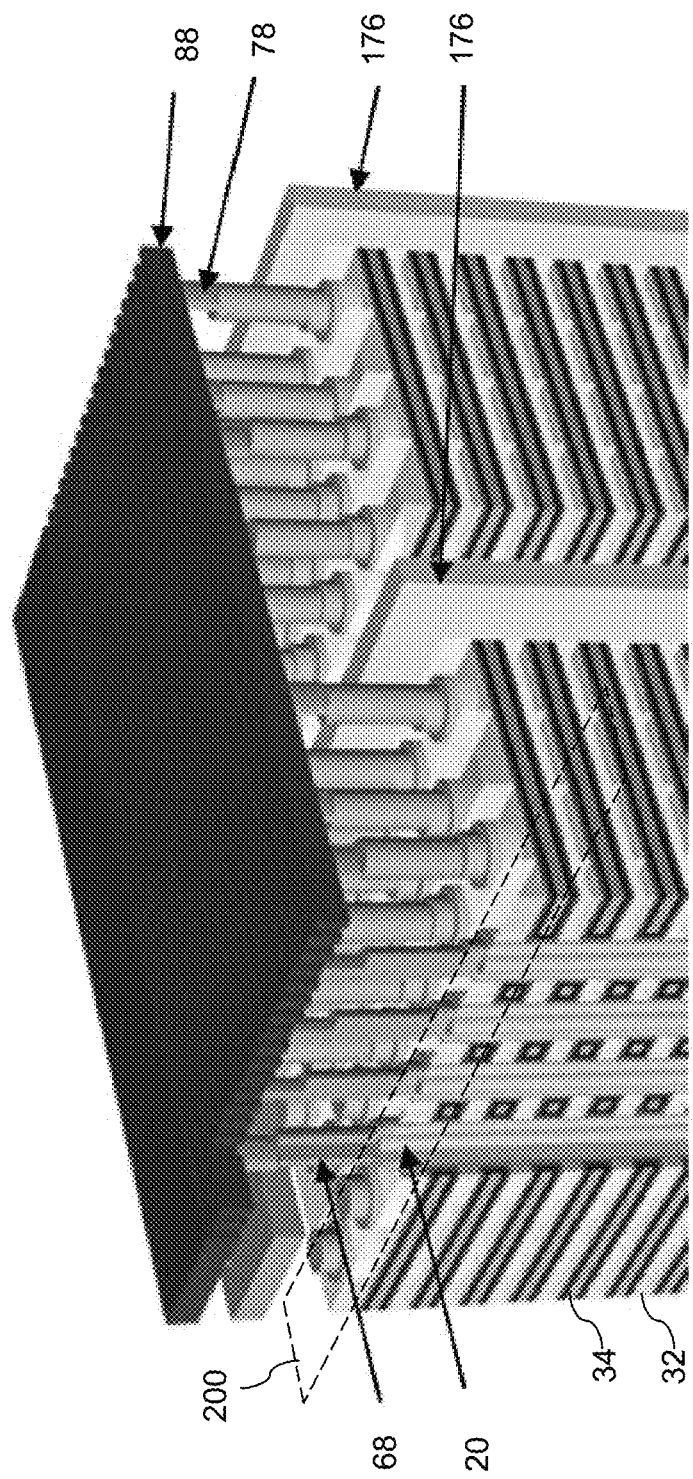
FIG. 3 is a perspective view of a cut-out portion of an exemplary structure, according to an embodiment of the present disclosure.

Referring to FIGS. 2 and 3, perspective views of a cut-out portion of the exemplary structure are shown. The various dielectric material layers between the at least one pillar-level dielectric cap layer (61, 63) and the capping dielectric layer 93 are not shown for clarity. Optionally, a passivation dielectric layer 95 can be formed above the capping dielectric layer 93.

The structures of the various embodiments of the present disclosure can provide low parasitic capacitance between the bit lines 88 and the plurality of contact pillars 68 due to the presence of the contiguous volume of a homogeneous composition that laterally surrounds the plurality of contact pillars 68 within a pillar-level structure. The reduction in the parasitic capacitance can reduce the RC delay of the bit lines 88 (or the integrated line and via structures), and increase the speed of operation of the device structure, which can include an array of vertical memory stacks, which can be, for example, a monolithic, three-dimensional array of NAND strings.

It is understood that the configuration of the bit lines 88 with respect to the underlying contact pillars 68 and contact via structures 78 can be implemented in configurations in which cavities are introduced within the pillar-level dielectric material layer 64 and the pillar-level dielectric material layer 74.

The embodiments described above can be combined to include an air gap or a low-k dielectric material associated with any one or more of contact pillars 68, contact via structures 78, and/or bit lines 88. Thus, the embodiments include any combination of an air gap or a low-k dielectric material for any given level. One embodiment includes an air gap or a low-k dielectric material surrounding contact pillars 68 and contact via structures 78, and located in between bit lines 88. Another embodiment includes an air gap or a low-k dielectric material surrounding contact pillars 68 and contact via structures 78, and located in between bit lines 88. Another embodiment includes an air gap or a low-k dielectric material only surrounding contact pillars 68, and contact via structures 78, but not located in between bit lines 88. Another embodiment includes an air gap or a low-k dielectric material surrounding contact pillars 68 and located in between bit lines 88, but not surrounding contact via structures 78. Another embodiment includes an air gap or a low-k dielectric material surrounding contact via structures 78, and located in between bit lines 88 but not surrounding contact pillars 68. Another embodiment includes an air gap or a low-k dielectric material only surrounding contact pillars 68. Another embodiment includes an air gap or a low-k dielectric material only surrounding contact via structures 78.

Each row 200 of memory stack structures 20 is located between a pair of wall-shaped via structures 176, which can contact an electrically conductive region within the substrate 10. The wall-shaped via structures 176 can be located in slit trenches that laterally extend along the first horizontal direction. In one embodiment, the slit trenches can extend to a top surface of the substrate 8. In this case, the wall-shaped via structures 176 can be conductive structures that function as source contact electrodes (e.g., source local interconnects), which contact a respective source region 12 in the substrate 8. In one embodiment, the slit trenches extend only through upper electrically conductive layers 34 (which may correspond to upper select gate electrodes such as drain-select gate electrodes). In this case, the well-shaped via structures 176 can be dielectric structures consisting essentially of dielectric materials. The electrically conductive layers 34 can be control gate electrodes (e.g., word line fingers) that extend in the word line direction (which can be the same as the first horizontal direction) between each pair of wall-shaped via structures 176. The word line direction is perpendicular to the bit line direction (which is the second horizontal direction).

Figure 4A:
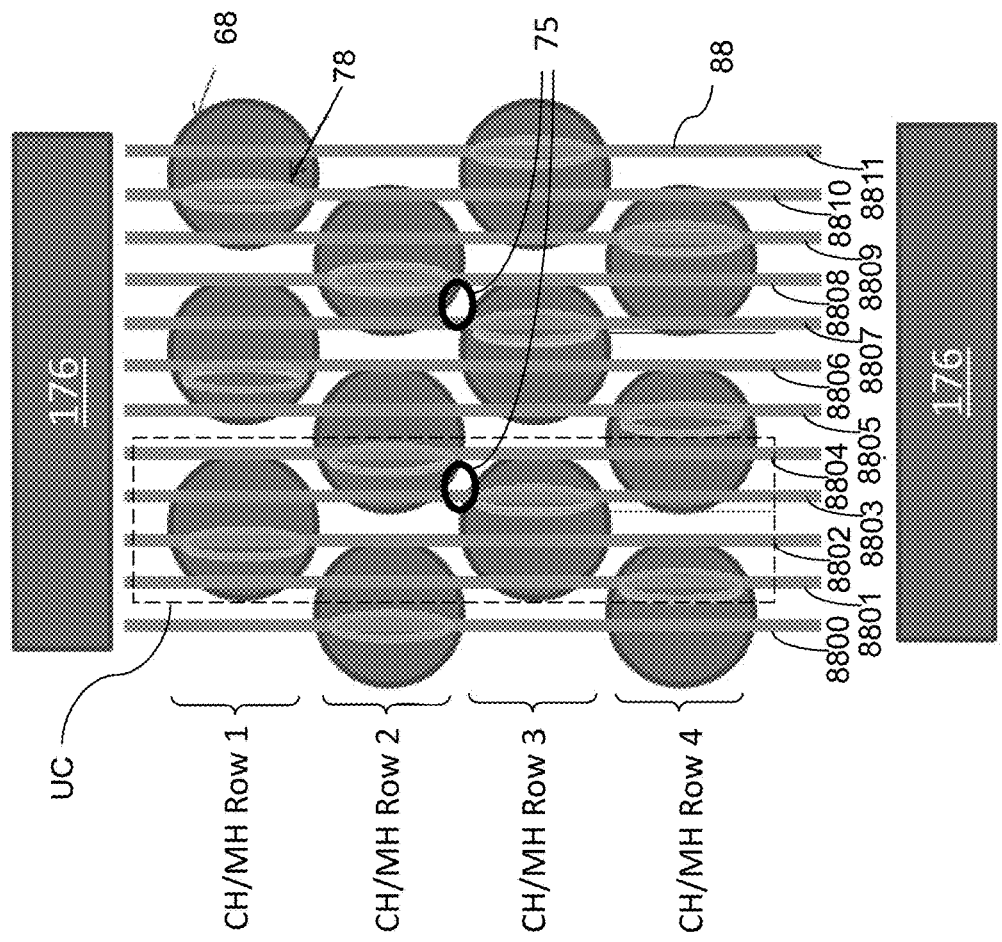
FIG. 4A is a plan view of a region of a reference configuration illustrating overlay between bit lines, contact pillars, and contact via structures.
Figure 4B:
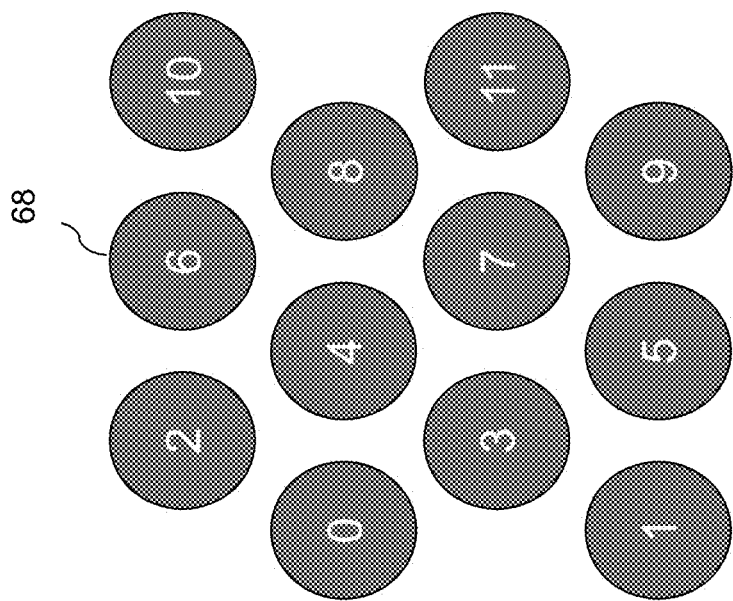
FIGS. 4B and 4C are plan views of a region of the reference configuration illustrating numbering of contact pillars according to respective associated bit line numbers and spacing between various elements.
Figure 4C:
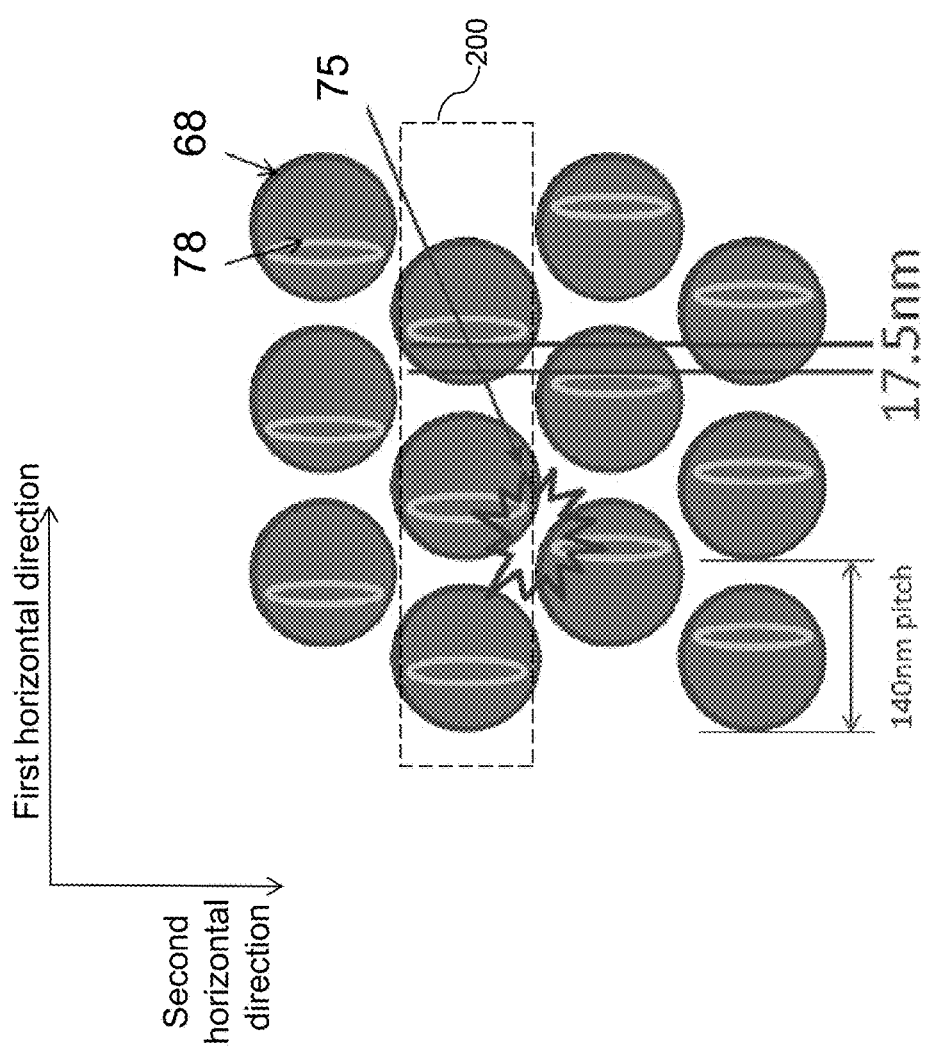

FIGS. 4A, 4B and 4C illustrate a reference configuration, which is a 4-folded memory stack structure layout. In other words, there are four rows 200 of memory stack structures 20 extending in the word line direction (the first horizontal direction) between each pair of adjacent slit trenches, which may include wall-shaped via structures 176. MH refers to memory stack structures 20, and CH refers to contact pillars 68. While the bit lines 88 extend along the second horizontal direction over, and beyond, the wall-shaped via structures 176, the bit lines 88 are shown only between the pair of wall-shaped via structures 176 for simplicity. Each bit line 88 is labeled with an identifier 88##, in which ## represents a double digit number that uniquely identifies each bit line and ranges from 00 to 11, corresponding to the 12 bit lines that are connected to 12 memory stack structures within three instances of unit cells UC, one of which is illustrated in FIG. 4A. Each contact pillar 68 is electrically shorted to only one bit line 88, and the double digit numbers ## that uniquely identifies each bit line 88 and each respective contact pillar 68 shorted to the respective bit line 88 are shown in FIG. 4B.

Thus, there are four rows of memory stack structures 20 extending through each word line finger, which is a portion of an electrically conductive layer 34 located between the adjacent pair of slit trenches. In one non-limiting aspect of a 4-folded memory stack structure layout, a unit cell UC includes sections of four bit lines 88, four respective contact via structures 78, four respective contact pillars 68, and four respective memory stack structures 20, which are electrically connected to the respective five bit lines 88. Each unit cell is located between a pair of wall-shaped via structures 176 and can be repeated as a one-dimensional periodic array along the first horizontal direction.

In this layout, the effective memory cell size is determined as follows:

Effective memory cell size=$p \times q/(R \times N)$,
in which,
p=memory stack structure pitch along the first horizontal direction (i.e., in the word line direction),
q=the width of the memory block region between the adjacent wall-shaped via structures 176 in the second horizontal direction (i.e., in the bit line direction),
R=the number of rows of memory stack structures between geometrical centers of the adjacent pair of wall shaped contact via structures, and
N=the total number of word lines as implemented by the electrically conductive layers 34.

For cost reduction, memory cell size reduction is desired. To reduce the memory cell size, p and/or q can be decreased, and/or R and N can be increased. Reduction of p increases the probability of electrical shorts among the contact via structures 78, which are herein referred to as "V1 shorts," or "first via level shorts." The reason for the V1 shorts is due to smaller distance between diagonally adjacent contact via structures 78 located around minimum V1 spacing regions 75, which has the shortest distance for adjoining pairs of contact via structures 78, as shown in FIGS. 4A and 4C. In contrast, V1-V1 spacing in other regions is much larger for other adjacent pairs of contact via structures 78. For example, as shown in FIG. 4C, when p is 140 nm, the V1-V1 spacing along the first horizontal direction can be about 17.5 nm in the minimum V1 spacing regions. In the above calculation, the lateral dimension of each contact via structure 78 and the lateral spacing between the contact via structures 78 along the first horizontal direction are assumed to be the same, i.e., 140 nm/8 for both the lateral dimension of a contact via structure 78 along the first horizontal direction and for the spacing along the first horizontal direction. In contrast, the spacing for adjacent pairs of contact via structures 78 along the first horizontal direction outside of the minimum V1 spacing region 75 is about 52.5 nm.

Each bit lines (8800-8811) contacts, and is electrically connected to, only one contact via structure 78 between the pair of wall-shaped via structures 176. Each contact via structure 78 contacts, and is electrically connected to, only one contact pillar 68 between the pair of wall-shaped via structures 176. In one embodiment, an entire area of each contact via structure 78 can overlap top surface of an underlying pillar structure 68. Each contact pillar 68 contacts, and is electrically connected to, an underlying memory stack structure 20.

In the configuration illustrated in FIGS. 4A and 4C, bit lines 8803 and 8804 are prone to electrical shorts through the pair of underlying contact via structures 78 separated by a minimum V1 spacing region 75. Other four-folded geometrical arrangements of contact via structures 78 that employs four rows of memory stack structures 20, four rows of contact pillars 68, and four rows of contact via structures 78 necessary results in formation of minimum V1 spacing regions 75 at different regions. In other words, for any four folded memory stack structure pattern, there will be adjacent pairs of contact via structures 78 that are separated by less than the pitch of the contact pillars, and thus, regions that are prone to electrical shorts at the level of the contact via structures 78.

Figure 5A:
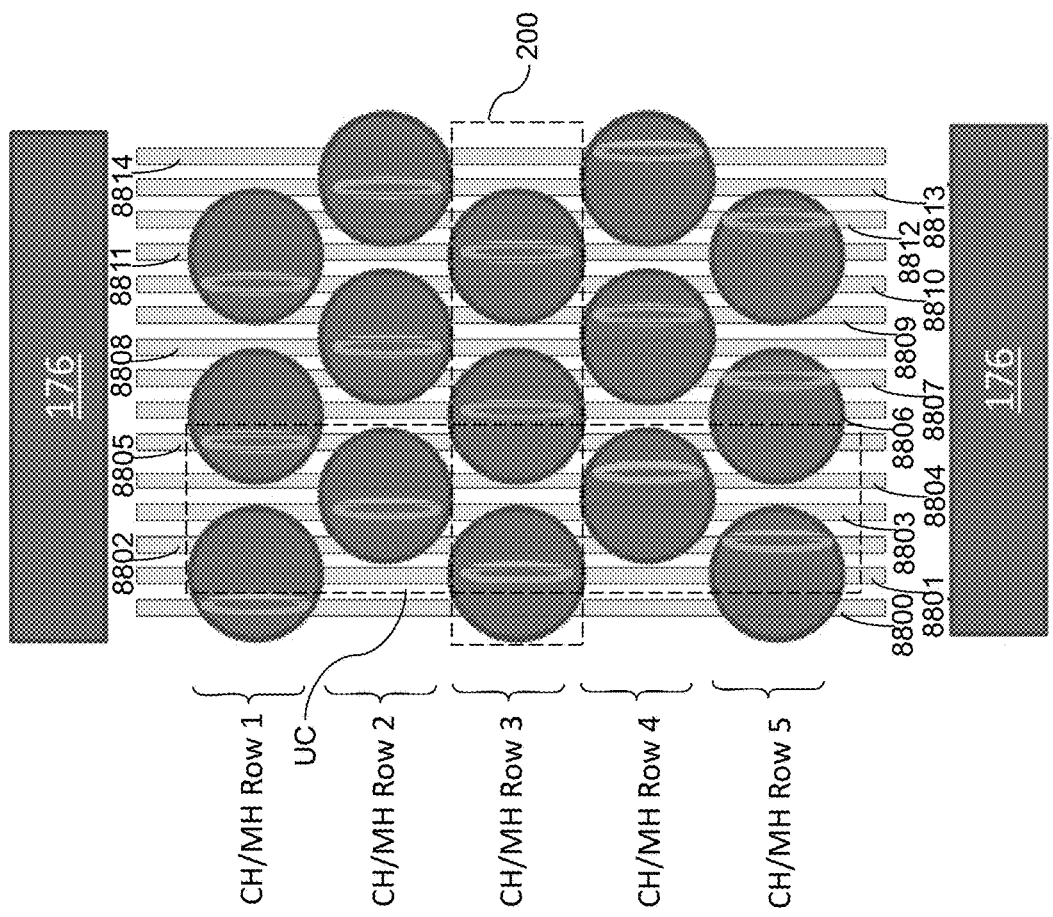
FIG. 5A is a plan view of a region of a first exemplary configuration illustrating overlay between bit lines, contact pillars, and contact via structures according to an embodiment of the present disclosure.
Figure 5B:
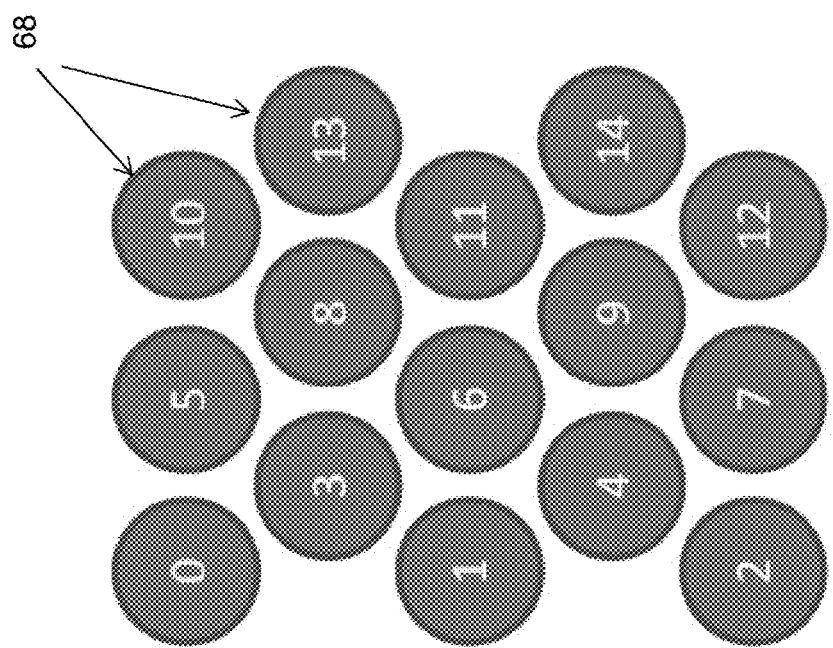
FIG. 5B is a plan view of a region of the first exemplary configuration illustrating numbering of contact pillars according to respective associated bit line numbers.

Referring to FIGS. 5A and 5B, a configuration according to an embodiment of the present disclosure is illustrated, which is a 5-folded memory stack structure layout. In other words, there are five rows 200 of memory stack structures 20 extending in the word line direction (the first horizontal direction) between each pair of adjacent slit trenches, which may include wall-shaped via structures 176. While the bit lines 88 extend along the second horizontal direction over, and beyond, the wall-shaped via structures 176, the bit lines 88 are shown only between the pair of wall-shaped via structures 176 for simplicity. Each bit line 88 is labeled with an identifier 88##, in which ## represents a double digit number that uniquely identifies each bit line and ranges from 00 to 14, corresponding to the 15 bit lines that are connected to 16 memory stack structures within three instances of unit cells UC, one of which illustrated in FIG. 5A. Each contact pillar 68 is electrically shorted to only one bit line 88, and the double digit numbers ## that uniquely identifies each bit line 88 and each respective contact pillar 68 shorted to the respective bit line 88 are shown in FIG. 5B.

Thus, there are five rows of memory stack structures 20 extending through each word line finger, which is a portion of an electrically conductive layer 34 located between the adjacent pair of slit trenches. In one non-limiting aspect of a 5-folded memory stack structure layout, a unit cell UC includes sections of five bit lines 88, five respective contact via structures 78, five respective contact pillars 68, and five respective memory stack structures 20, which are electrically connected to the respective five bit lines 88. Each unit cell is located between a pair of wall-shaped via structures 176 and can be repeated as a one-dimensional periodic array along the first horizontal direction. Thus, the NAND memory device has at least a five-folded configuration comprising at least five rows of memory holes filled with a channel 24 and memory film 22 in each memory block between adjacent trenches.

Each bit lines (8800-8815) contacts, and is electrically connected to, only one contact via structure 78 between the pair of wall-shaped via structures 176. Each contact via structure 78 contacts, and is electrically connected to, only one contact pillar 68 between the pair of wall-shaped via structures 176. In one embodiment, an entire area of each contact via structure 78 can overlap top surface of an underlying pillar structure 68. Each contact pillar 68 contacts, and is electrically connected to, an underlying memory stack structure 20.

Within each unit cell UC, five bit lines 88 extend over five memory stack structures 20, five contact pillars 68, and five contact via structures 78. Only one of the five bit lines 88 is electrically connected to any given contact pillar 68 and an underlying memory stack structure 20. The five-fold memory stack structure can be modified to form six-fold, seven-fold, eight-fold, nine-fold, or ten-fold memory stack structures by adding another instance of CH/MH row 1 between CH/MH row 5 and the adjacent wall-shaped via structure 176, adding additional instances of CH/MH row 1 and CH/MH row 2 in that order between CH/MH row 5 and the adjacent wall-shaped via structure 176, adding additional instances of CH/MH row 1, CH/MH row 2, and CH/MH row 3 in that order between CH/MH row 5 and the adjacent wall-shaped via structure 176, or adding additional instances of CH/MH rows 1-4 in that order between CH/MH row 5 and the adjacent wall-shaped via structure 176, or adding additional instances of CH/MH rows 1-5 in that order between CH/MH row 5 and the adjacent wall-shaped via structure 176, respectively.

Figure 6:
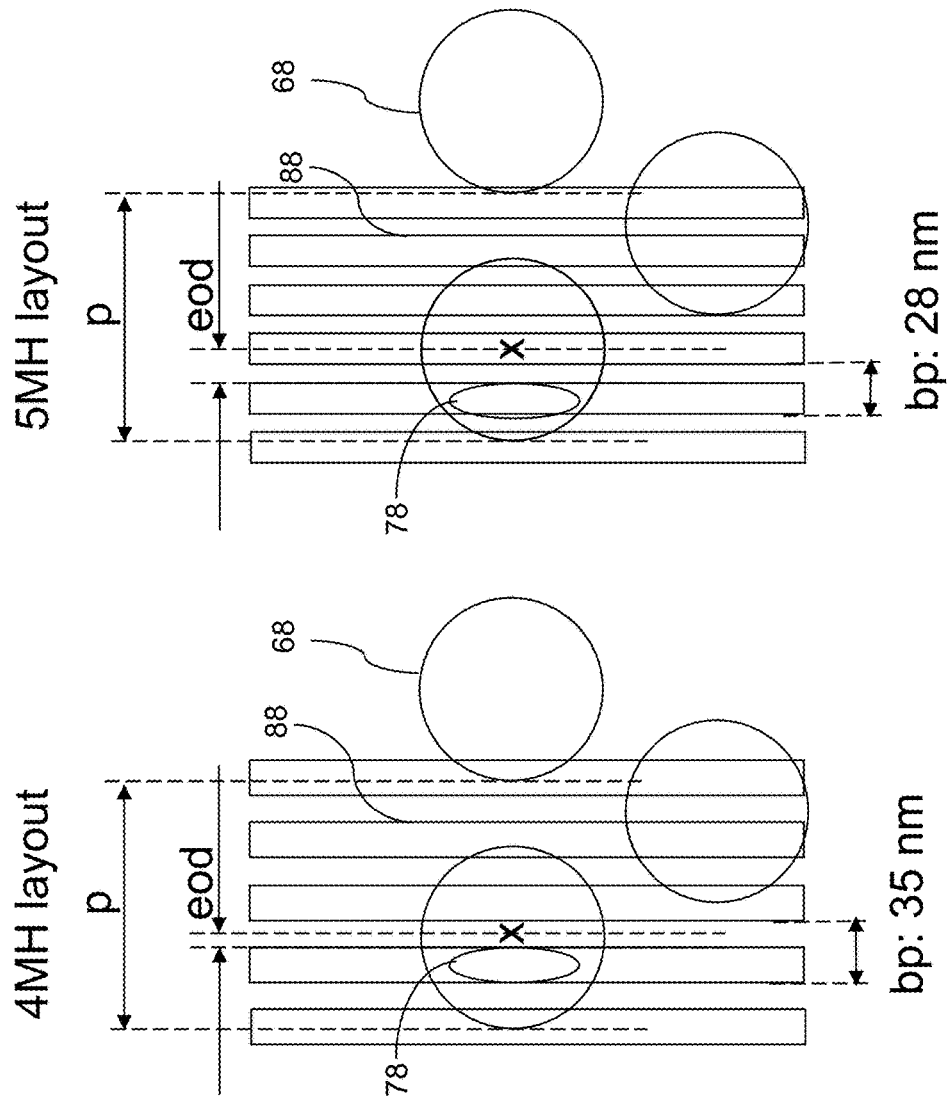
FIG. 6 shows a comparison of pitches and edge offsets for bit lines between the reference configuration and the first exemplary configuration.

According to an aspect of the present disclosure, a three-dimensional semiconductor device is provided, which includes an alternating stack of insulating layers 32 and electrically conductive layers 34 located over a substrate 8, memory stack structures 20 extending through the alternating stack and arranged in at least five rows 200 that extend along a first horizontal direction, contact via structures 78 arranged in a same number of rows as the memory stack structures 20 and overlying the memory stack structures 20 such that each of the contact via structures 78 is electrically connected to a semiconductor channel 24 of a respective memory stack structure 20, and bit lines 88 contacting a respective contact via structure 78 and extending along a second horizontal direction that is different from the first horizontal direction, and arranged as a periodic array of bit lines 88 having a bit line pitch bp along the first horizontal direction, as shown in FIG. 6. A geometrical center of each contact via structure 78 is laterally offset along the first horizontal direction from a geometrical center of each contact via structure 78 in any adjacent row of the contact via structures 78 by at least twice the bit line pitch bp. In one embodiment, adjacent bit lines are not electrically connected to semiconductor channels in nearest neighbor memory holes.

In one embodiment, the three-dimensional semiconductor device can include a pair of wall-shaped via structures 176 (which can be conductive structures such as source contact structures as illustrated in FIG. 1A, or may be dielectric structures) extending through the alternating stack, optionally contacting the substrate 8, and laterally extending along the first horizontal direction. The memory stack structures 20 can be located between pair of wall-shaped via structures 176. Each subset of the memory stack structures 20 that is located within a same row may be arranged as a periodic one-dimensional array having a memory stack structure pitch p along the first horizontal direction. In one embodiment, the memory stack structure pitch p can be the same as a product of the bit line pitch bp and the total number of rows 200 of the memory stack structures 20 between the pair of wall-shaped via structures 176. In other words, for a five-folded configuration with five rows 200, five bit lines 88 are located in the area of one pitch p in the first horizontal direction, for a six-folded configuration with five rows 200, six bit lines 88 are located in the area of one pitch p in the first horizontal direction, etc.

In one embodiment, the three-dimensional semiconductor device can include drain regions 58. Each of the drain regions 58 can contact a top end of a vertical semiconductor channel 24 within a respective memory stack structure 20 and can be electrically shorted to a respective contact via structure 78. In one embodiment, the three-dimensional semiconductor device can include contact pillars 68. Each of the contact pillars 68 can contact a top surface of a respective drain region 58 and a bottom surface of a respective contact via structure 78.

In one embodiment, the entirety of the memory stack structures 20 can be arranged in a two-dimensional hexagonal array. In other words, the axes of the memory stack structures 20 can be located at vertices of a two-dimensional hexagonal array in a plan view. In one embodiment, the entirety of the contact pillars 68 can be arranged as a two-dimensional hexagonal array that is commensurate with the two-dimensional hexagonal array of the memory stack structures as illustrated in FIGS. 5A and 5B.

Referring to FIG. 6, the reference configuration of FIGS. 4A and 4B and the embodiment configuration of FIGS. 5A and 5B are illustrated for cases employing the same memory stack structure pitch p of 140 nm along the first horizontal direction. The bit line pitch bp is 35 nm for the reference configuration because four bit lines 88 are located within the memory stack structure pitch p of 140 nm. The bit line pitch bp is 28 nm for the embodiment configuration because five bit lines 88 are located within the memory stack structure pitch of 140 nm. Despite the decrease in the bit line pitch bp in the embodiment configuration relative to the reference configuration, the minimum spacing between contact via structures 78 along the first horizontal direction (i.e., the V1-V1 spacing along the first horizontal direction) increases. In case the width of the contact via structures 78 is one half of the bit line pitch in both configurations, the minimum spacing between contact via structures 78 along the first horizontal direction is 42 nm for the embodiment configuration, and is 17.5 nm for the reference configuration. Thus, use of the five-folded memory stack configuration results in an increase in the minimum spacing between contact via structures 78 along the first horizontal direction with respect to the four-folded memory stack configuration. The increase in the minimum spacing between contact via structures 78 along the first horizontal direction provides a larger lithography margin for patterning the contact via structures 78, thereby avoiding V1-V1 shorts. Generally speaking, the five-folded memory stack structure configuration can provide a minimum spacing between contact via structures 78 along the first horizontal direction (i.e., a minimum V1-V1 spacing along the first horizontal direction) that is greater than the bit line pitch bp. In one embodiment, the five-folded memory stack structure configuration can provide a minimum spacing between contact via structures 78 along the first horizontal direction that is about 3/2 of the bit line pitch bp.

FIG. 6 illustrates a feature of the embodiment configuration of the present disclosure. For the 4-folded memory stack structure layout shown on the left of FIG. 6, each contact via structure 78 can be positioned within an area in proximity to the geometrical center of an underlying contact pillar 68. In an optimized version of the 4-folded memory stack structure layout of FIG. 4A, the edge offset distance eod between the geometrical center of any contact pillar 68 and a proximal sidewall (i.e., a sidewall that is closer to the geometrical center of the contact pillar 68) of the overlying, and contacting, bit line 88 can be about 8.75 nm. For an optimized version of the 5-folded memory stack structure layout of FIG. 5A (shown on the right of FIG. 6), the edge offset distance eod between the geometrical center of any contact pillar 68 and a proximal sidewall (i.e., a sidewall that is closer to the geometrical center of the contact pillar 68) of the overlying, and contacting, bit line 88 can be about 21 nm for some of the contact via structures 78. Furthermore, the bit line pitch, bp, is decreased from 35 nm in the four-folded configuration to a 28 nm in the five-folded configuration. It should be noted that all of the dimensions described above are exemplary and provided for illustration of one hypothetical example, and should not be considered limiting on the scope of the claims.

Figure 7:
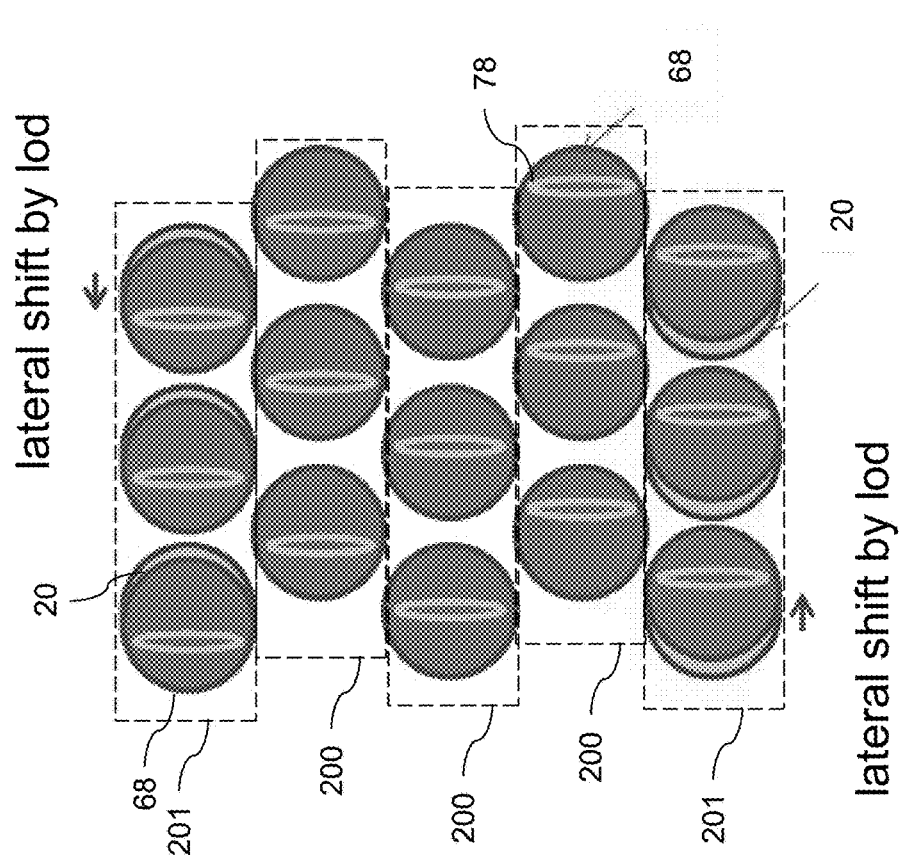
FIG. 7 illustrates a second exemplary configuration for the contact pillars and contact via structures according to an embodiment of the present disclosure.
Figure 8:
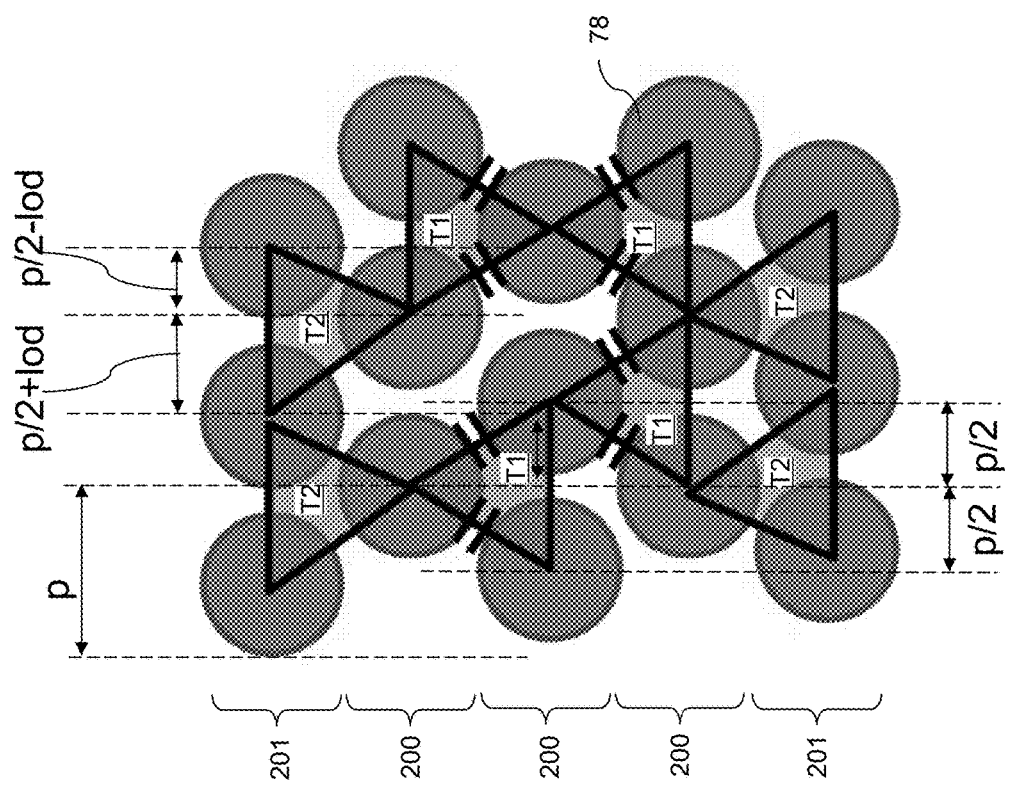
FIG. 8 illustrates geometrical components of the second exemplary configuration according to an embodiment of the present disclosure.

Referring to FIGS. 7 and 8, an embodiment of the present disclosure is illustrated, which increases the lithography margin for printing the pattern for the contact via structures 78. An n-folded memory stack structure configuration can be employed in which n is an integer not less than 5, e.g., 5, 6, 7, 8, 9, 10, 11, or 12, etc.

The contact pillars 68 in the outermost rows 201 can be laterally shifted by a lateral offset distance lod along the first horizontal direction with respect the underlying memory stack structure 20 and with respect to the overlying contact via structure 78. The contact pillars 68 in the outermost rows 201 can also be laterally shifted by a lateral offset distance lod along the first horizontal direction with respect to the contact pillars in the middle rows 200. In an illustrative example, each contact pillar 68 in the outermost rows 201 can be laterally shift distance lod can be within 10% to 50% of the bit line pitch bp. For example, the lateral offset distance lod can be in a range from 5 to 15 nm, such as 10 nm. The direction of the lateral offset distance lod can be along the word line direction (i.e., along the first horizontal direction) that is perpendicular to the bit line direction (i.e., the second horizontal direction).

The introduction of a finite lateral offset distance lod can mitigate the overlay requirement between the contact pillars 68 and the contact via structures 78 by reducing the maximum value of the edge offset distance eod described in FIG. 6. Specifically, the contact pillars 68 in the outermost rows 201 can be shifted along the direction that reduces the edge offset distance along the first horizontal direction. In this case, the contact pillars 68 can be offset along the first horizontal direction with respect to the underlying periodic structures (which may be hexagonal periodic structures) of the memory stack structures 20, and with respect to the overlying contact via structures 78.

In this case, the geometrical centers of any triplet of geometrically adjacent contact pillars 68 within rows 200 excluding the outermost rows 201 can form isosceles triangles T1, i.e., triangles having two equal sides. Correspondingly, the lateral separation distance along the first horizontal direction between the apexes of each isosceles triangle can be either one half of the memory stack structure pitch (i.e., p/2) or the memory stack structure pitch p.

The geometrical centers of any triplet of geometrically adjacent contact pillars 68 including at least one contact pillar 68 from an outermost row 201 can form scalene triangles T2, i.e., triangles having three different sides. As used herein, geometrically adjacent contact pillars refer to any set of contact pillars that do not include a contact pillar located between a pair of contact pillars. Correspondingly, the lateral separation distance along the first horizontal direction between the apexes of each scalene triangle can be the sum of one half of the memory stack structure pitch and the lateral offset distance (i.e., p/2+lod), the difference between one half of the memory stack structure pitch and the lateral offset distance (i.e., p/2−lod), or the memory stack structure pitch p.

In one embodiment, the entirety of the memory stack structures 20 can be arranged in a two-dimensional hexagonal array, and a geometrical center of each contact pillar 68 overlying a subset of memory stack structures 20 located at outermost rows 201 of the memory stack structures 20 can be laterally offset from an axis passing through a geometrical center of a respective underlying memory stack structure 20 to which the contact pillar 68 is electrically connected as illustrated in FIGS. 7 and 8.

In one embodiment, each outermost row 201 of the memory stack structures 20 can be laterally offset from a hexagonal two-dimensional array formed by inner rows of the memory stack structures 20 along the first horizontal direction by a respective finite lateral offset distance lod. In one embodiment, the lateral offsets of two outermost rows 201 of the memory stack structures 20 can be equal in magnitude and opposite in direction as illustrated in FIG. 7.

In one embodiment, each triangle connecting neighboring geometrical centers of contact pillars 68 in rows except outermost rows 201 of the contact pillars 68 in a plan view can forms an isosceles triangle T1, and each triangle connecting neighboring geometrical centers of contact pillars 68 in an outermost row 201 and another row adjacent to the outermost row 201 in a plan view can form a scalene triangle T2.

According to an aspect of the present disclosure, a three-dimensional semiconductor device is provided, which comprises an alternating stack of insulating layers 32 and electrically conductive layers 34 located over a substrate 8, memory stack structures 20 extending through the alternating stack and arranged in a first two-dimensional hexagonal array including at least five rows (200, 201) that extend along the first horizontal direction, and contact pillars 68 arranged in a same number of rows as the memory stack structures 20 and overlying the memory stack structures 20. Each of the contact pillars 68 can be electrically connected to a semiconductor channel 24 of a respective memory stack structure 20. A first subset of contact pillars 68 including contact pillars 68 located between outermost rows 201 can be arranged in a second two-dimensional hexagonal array that is commensurate with a portion of the first two-dimensional hexagonal array. A geometrical center of each contact pillar 68 in a second subset of contact pillars 68 including contact pillars located at the outermost rows 201 can be laterally offset from an axis passing through a geometrical center of a respective underlying memory stack structure 20.

In one embodiment, the second two-dimensional hexagonal array can coincide with a portion of the first two-dimensional hexagonal array. In one embodiment, a pair of wall-shaped via structures 176 extending through the alternating stack, optionally contacting the substrate 8, and laterally extending along a first horizontal direction can be provided. The memory stack structures 20 can be located between the pair of wall-shaped via structures 176. The pair of wall-shaped via structures 176 can be a pair of source contact structures (including a conductive material as illustrated in FIG. 1A), a pair of dielectric material portions (that can function as separators for select-drain electrodes), or a combination thereof.

In one embodiment, the three-dimensional semiconductor device can include contact via structures 78 arranged in a same number of rows as the memory stack structures 20 and overlying the contact pillars 68. Each of the contact via structures 78 can contact an underlying contact pillar 68. Bit lines 88 can contact a respective contact via structure 78 and can extend along a second horizontal direction that is different from the first horizontal direction. Each of the bit lines 88 can be electrically shorted to a respective drain region 58.

The bit lines 88 can be arranged as a periodic array of bit lines having a bit line pitch bp along the first horizontal direction. In one embodiment, the geometrical center of each contact via structure 78 can be laterally offset along the first horizontal direction from a geometrical center of each contact via structure 78 in any adjacent row 200 of the contact via structures 78 by at least twice the bit line pitch bp as illustrated in FIGS. 5A, 5B, 7, and 8.

In each embodiment of the present disclosure, each of the memory stack structures 20 can include, from outside to inside, optional blocking dielectric (which may be a portion of the memory film 22), memory elements (as embodied as portions of a memory material layer or discrete floating gate electrodes within a memory film 22), a tunneling dielectric (which is a portion of the memory film 22), and a vertical semiconductor channel 24. The memory stack structures 20 extending through the alternating stack (32, 34) can be arranged in exactly five rows or more than five rows. The contact via structures 78 can be elongated along the second horizontal direction. More than 50% of the contact via structures 78 can have a respective geometrical center that is laterally offset from an axis passing through a geometrical center of a respective underlying memory stack structure 20 (which has an areal overlap with the respective contact via structure 20).

In each embodiment of the present disclosure, the three-dimensional semiconductor device may include a vertical NAND device located over the substrate 8. The electrically conductive layers 34 can include, or can be electrically connected to, a respective word line (as embodied as portions that surround the memory stack structures 20) of the vertical NAND device. The substrate 8 can comprise a silicon substrate. The vertical NAND device can comprise an array of monolithic three-dimensional NAND strings located over the silicon substrate. At least one memory cell in a first device level of the three-dimensional array of NAND strings can be located over another memory cell in a second device level of the three-dimensional array of NAND strings. The silicon substrate can contain an integrated circuit comprising a driver circuit for the memory device located thereon. The array of monolithic three-dimensional NAND strings can include a plurality of semiconductor channels, a plurality of charge storage elements, and a plurality of control gate electrodes having a strip shape extending substantially parallel to the top surface of the substrate 8. At least one end portion of each of the plurality of semiconductor channels can extend substantially perpendicular to a top surface of the substrate 8. Each charge storage element can be located adjacent to a respective one of the plurality of semiconductor channels 24. The plurality of control gate electrodes can comprise at least a first control gate electrode located in the first device level and a second control gate electrode located in the second device level.

Electrical shorts between adjacent pairs of contact via structures for memory stack structures can be minimized by employing a configuration of five or more memory stack structures in each block of memory stack structures. In a configuration including five or more rows of the memory stack structures and contact via structures in each memory block, each contact via structure can be laterally spaced from other contact via structures in neighboring rows by at least twice the bit line pitch of the bit lines that contact top surfaces of the contact via structures. Optionally, contact pillars can be provided between the memory stack structures and the contact via structures. Outermost rows of the contact pillars may be laterally offset along the row direction with respect to the memory stack structures to allow increase in the lateral offset distance for outermost rows of the contact via structures.

The embodiments of the disclosure provide the following non-limiting advantages: cell size reduction, larger process margin due to increased V1 lithography margin, and higher performance. The higher numbers of folded memory stack structures and smaller memory stack structure pitch p can permit the total word line length to be reduced for the same page size. Shorter word line length will give smaller RC delay, and read and program speed can be improved.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional semiconductor device comprising:
an alternating stack of insulating layers and electrically conductive layers located over a substrate;
memory stack structures extending through the alternating stack and arranged in at least five rows that extend along a first horizontal direction;
contact via structures arranged in a same number of rows as the memory stack structures and overlying the memory stack structures, each of the contact via structures being electrically connected to a semiconductor channel of a respective memory stack structure;
bit lines contacting a respective contact via structure and extending along a second horizontal direction that is different from the first horizontal direction, and arranged as a periodic array of bit lines having a bit line pitch along the first horizontal direction;

a pair of wall-shaped via structures extending through the alternating stack, and laterally extending along the first horizontal direction, wherein the at least five rows of memory stack structures are located between pair of wall-shaped via structures; and contact pillars arranged in a same number of rows as the memory stack structures and overlying the memory stack structures, each of the contact pillars being electrically connected to a semiconductor channel of a respective memory stack structure, wherein rows of the contact pillars include two outermost rows of contact pillars;

wherein:

inner rows of the memory stack structures of the at least five rows of memory stack structures that extend along a first horizontal direction are arranged in a two-dimensional hexagonal array; and each outermost row of the memory stack structures of the at least five rows of the memory stack structures that extends along a first horizontal direction is laterally offset along the first horizontal direction by a respective lateral offset distance from the two-dimensional hexagonal array formed by the inner rows of the memory stack structures;

the memory stack structures are further arranged in multiple periodic one-dimensional arrays having a same memory stack structure pitch along the first horizontal direction;

a subset of contact pillars excluding the two outermost rows of contact pillars has an identical array pattern as a subset of the memory stack structures that underlie the subset of contact pillar structures;

each contact pillar in the outermost rows are laterally shifted along a direction that reduces an edge offset distance along the first horizontal direction with respect to the first two-dimensional hexagonal array of the memory stack structures;

each contact pillar within the two outermost rows of contact pillars is laterally shifted by a lateral offset distance along the first horizontal direction or along an opposite direction of the first direction with respect to a respective underlying memory stack structure, the lateral offset distance being in a range from 10% to 50% of the bit line pitch;

the contact pillars located in different outermost rows are laterally shifted in opposite directions;

the contact pillars located in a same outermost row are laterally shifted in a same direction;

geometrical centers of any triplet of geometrically adjacent contact pillars within rows excluding the outermost rows form isosceles triangles; and geometrical centers of any triplet of geometrically adjacent contact pillars including at least one contact pillar from an outermost row form scalene triangles.

2. The three-dimensional semiconductor device of claim 1, wherein:

the lateral offsets of two outermost rows of the memory stack structures are equal in magnitude and opposite in direction;

a geometrical center of each contact via structure is laterally offset along the first horizontal direction from a geometrical center of each contact via structure in any adjacent row of the contact via structures by at least twice the bit line pitch; and wherein each subset of the memory stack structures within a same row is arranged as a periodic one-dimensional array having a memory stack structure pitch along the first horizontal direction.

3. The three-dimensional semiconductor device of claim 2, wherein the memory stack structure pitch is the same as a product of the bit line pitch and a total number of rows of the memory stack structures between the pair of wall-shaped via structures.

4. The three-dimensional semiconductor device of claim 1, further comprising drain regions, each of the drain regions contacting a top end of a vertical semiconductor channel within a respective memory stack structure and electrically shorted to a respective contact via structure.

5. The three-dimensional semiconductor device of claim 1, wherein each of the memory stack structures comprises, from outside to inside, memory elements, a tunneling dielectric, and a vertical semiconductor channel.

6. The three-dimensional semiconductor device of claim 1, wherein the memory stack structures extending through the alternating stack are arranged in exactly five rows.

7. The three-dimensional semiconductor device of claim 1, wherein the contact via structures are elongated along the second horizontal direction.

8. The three-dimensional semiconductor device of claim 1, wherein:

the three-dimensional semiconductor device comprises a vertical NAND device located over the substrate;

the electrically conductive layers comprise, or are electrically connected to, a respective word line of the vertical NAND device;

the substrate comprises a silicon substrate;

the vertical NAND device comprises an array of monolithic three-dimensional NAND strings located over the silicon substrate;

at least one memory cell in a first device level of the three-dimensional array of NAND strings is located over another memory cell in a second device level of the three-dimensional array of NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

9. A three-dimensional semiconductor device comprising:

an alternating stack of insulating layers and electrically conductive layers located over a substrate:

memory stack structures extending through the alternating stack and arranged in a first two-dimensional hexagonal array including at least five rows that extend along the first horizontal direction;

contact pillars arranged in a same number of rows as the memory stack structures and overlying the memory stack structures, each of the contact pillars being electrically connected to a semiconductor channel of a respective memory stack structure;

contact via structures arranged in a same number of rows as the memory stack structures and overlying the contact pillars, each of the contact via structures contacting an underlying contact pillar; and bit lines contacting a respective contact via structure and extending along a second horizontal direction that is different from the first horizontal direction, wherein each of the bit lines is electrically shorted to a respective drain region;

wherein:

a first subset of contact pillars including contact pillars located between outermost rows is arranged in a second two-dimensional hexagonal array that is commensurate with a portion of the first two-dimensional hexagonal array;

a geometrical center of each contact pillar in a second subset of contact pillars including contact pillars located at the outermost rows is laterally offset from an axis passing through a geometrical center of a respective underlying memory stack structure;

the bit lines are arranged as a periodic array of bit lines having a bit line pitch along the first horizontal direction;

the first subset of contact pillars directly overlies, and is aligned with, an underlying portion of the first two-dimensional hexagonal array;

the geometrical center of each contact pillar in a second subset of contact pillars is laterally shifted along a direction that reduces an edge offset distance along the first horizontal direction with respect to the first two-dimensional hexagonal array of the memory stack structures;

a geometrical center of each contact via structure is laterally offset along the first horizontal direction from a geometrical center of each contact via structure in any adjacent row of the contact via structures by at least twice the bit line pitch;

each contact pillar within the two outermost rows of contact pillars is laterally shifted by a lateral offset distance along the first horizontal direction or along an opposite direction of the first direction with respect to a respective underlying memory stack structure, the lateral offset distance being in a range from 10% to 50% of the bit line pitch;

geometrical centers of any triplet of geometrically adjacent contact pillars within rows excluding the outermost rows form isosceles triangles; and geometrical centers of any triplet of geometrically adjacent contact pillars including at least one contact pillar from an outermost row form scalene triangles.

* * * * *